United States Patent
Morris et al.

[11] Patent Number: 5,877,966
[45] Date of Patent: Mar. 2, 1999

[54] SYSTEM AND METHOD FOR CREATING CONFIGURATIONS USING TEMPLATES

[75] Inventors: James McCabe Morris, Mountain View; John Gerard Cleary, Woodside, both of Calif.

[73] Assignee: Pantheon Solutions, Inc., Mountain View, Calif.

[21] Appl. No.: 617,375

[22] Filed: Mar. 18, 1996

Related U.S. Application Data

[63] Continuation of Ser. No. 250,817, May 31, 1994, Pat. No. 5,500,802.

[51] Int. Cl.⁶ ..................................................... G06F 17/50
[52] U.S. Cl. ................ 364/512; 364/468.03; 364/474.24
[58] Field of Search ............................. 364/512, 468.01, 364/468.03, 474.24; 345/333, 328, 335, 356; 395/51, 50, 60, 63

[56] References Cited

U.S. PATENT DOCUMENTS

| | | | |
|---|---|---|---|
| 4,591,983 | 5/1986 | Bennett et al. | 364/403 |
| 4,875,162 | 10/1989 | Ferriter et al. | 364/401 |
| 4,964,060 | 10/1990 | Hartsog | 364/512 |
| 5,019,992 | 5/1991 | Brown et al. | 364/468 |
| 5,033,014 | 7/1991 | Carver et al. | 364/571.01 |
| 5,109,337 | 4/1992 | Ferriter et al. | 364/401 |
| 5,165,015 | 11/1992 | Coggins | 395/155 |
| 5,201,046 | 4/1993 | Goldberg et al. | 395/600 |
| 5,216,612 | 6/1993 | Cornett et al. | 364/468 |
| 5,255,207 | 10/1993 | Cornwell | 364/512 |
| 5,260,866 | 11/1993 | Lisinski et al. | 364/401 |
| 5,321,620 | 6/1994 | Tanaka et al. | 364/468 |
| 5,617,514 | 4/1997 | Dolby et al. | 395/51 |
| 5,630,025 | 5/1997 | Dolby et al. | 395/51 |
| 5,675,752 | 10/1997 | Scott et al. | 345/333 |

FOREIGN PATENT DOCUMENTS

WO 94/23372    10/1994    WIPO .

OTHER PUBLICATIONS

Trilogy Press Release 1.0, Oct. 31, 1991.

*Primary Examiner*—Vincent N. Trans
*Attorney, Agent, or Firm*—Marger Johnson & McCollom

[57] ABSTRACT

The present invention is a novel system that allows the user to create, modify, or delete a configurator using templates. Once the configurator is constructed, the present invention allows the user to generate specific configurations using the constructed configurator. Templates are objects that are created by the configurator generator and recognized and used by the configurator to create configurations. Templates are stored in a persistent storage area of the configurator generator and are recalled when a change or deletion to the resulting configurator is desired. The configurator generator provides the user with a simple, intuitive, and computer assisted way of producing or modifying templates. A user defines a specific domain that describes an end product through a graphical interface of the system thereby creating a set of templates. The system then takes the user-defined templates to create configurations of the end product.

13 Claims, 26 Drawing Sheets

SYSTEM AND METHOD FOR CREATING CONFIGURATIONS USING TEMPLATES

RELATED APPLICATIONS

This is a continuation application of Ser. No. 08/250,817, filed May 31, 1994, now U.S. Pat. No. 5,500,802.

FIELD OF THE INVENTION

The present invention relates in general to a system which allows users to create a product or service-specific configurator system and, in particular, to a system that employs templates for allowing user-supplied definition of a given product or service.

BACKGROUND OF THE INVENTION

Today's businesses supply customers with a complex array of end services and/or products—each such end service or product may, in turn, comprise a number of constituent services and products. A typical example is that of a vendor of computer systems for a variety of customers (e.g. individual home users interested in personal computers, businesses interested in client/server systems, etc). Such a vendor is often faced with the task of recommending to the customer an optimal "configuration" to meet the customer's particular needs. More precisely, a "configuration" is a collection of constituent parts that comprise an end product or service. A "product" may comprise one or more physical objects or one or more services or any combination of products and services.

The recommendation of a particular system configuration depends upon both the external needs of the customer and the internal needs of the constituent parts that comprise the end product. For example, such a vendor may recommend to the customer a particular configuration that has a certain amount of disk space storage, a certain number of disk drives, choice of monitor, and the like to meet the desired level of functionality or price/performance desired by the customer.

From these external customer needs, individual parts comprising the end system are identified. To supply a completely usable computer system, however, the needs of the identified parts must also be satisfied by the system when ultimately put together in a unified system. For example, the fact that a desired configuration has 2 disk drives and a CD-ROM drive means that the system should be equipped with a sufficient power supply and space in the cabinet to house these various drives. These "internal" needs are not necessarily known to the user at the time of order; but must be satisfied nonetheless.

Recommending a suitable configuration may be a complex task whose complexity grows with the number of constituent parts, the external needs of the customer, and the internal needs of the parts when considered as a whole. To aid such vendors, "configuration systems" (or "configurators") have been developed that automate, partially or otherwise, the process of choosing a particular configuration that makes sense for the customer.

These configurators typically comprise large software modules that in some sense capture the nature of the product of the vendor. For example, the configurator itself contains information concerning the various components that comprise the product and the various choices that might go into selecting a suitable set of such components to comprise an end product. Additionally, some configurators allow for user preferences to be considered by the system in order to customize an order. For example, a user might specify a price or a performance need that would be considered by the configurator while deciding upon a set of possible configurations for the user.

Adding such information and knowledge of the vendor's product typically requires a certain amount of programming. Some configurators employ a rule-based expert system to specify the relationships between the various components and evaluate potential configurations against a set of user and product constraints. These rules are input into a knowledge base that is then acted upon by an inference engine. In response to a query, the inference engine accesses the rules that represent the various constraints and relationships of the end product and a set of possible configurations that satisfy those constraints and relationships is produced.

Other configurators use an object oriented programming approach to capture the various relationships. The end product may be thought of as a subassembly of parts that may themselves be subassemblies. Parts that are functionally equivalent to one another (i.e. may be substantial substitutes for one another to meet a certain system requirement) may be represented as members of a "class".

More specifically, a class is a description of a set of objects that have similar characteristics, attributes, and behaviors. Individual members of a class are "instances" of the class. The action in a object oriented program takes place by passing messages to and from objects. An object is said to "behave" in a certain way in response to messages passed to it. Usually, the behavior is the execution of a procedure that bears the same name as the message. Classes are usually convenient stores of behaviors that are common to all the instances comprising the class. Thus, when a message is passed to an instance, its behavior is determined by its class—that is, the appropriate procedure is found in the class, and not in the instance itself. These procedures and class definitions are commonly written in an object-oriented programming language such as C++ or Smalltalk. The common aspect to these typical configurators is that a good deal of programming is required to capture the "domain" of a vendor's end products. A "domain" of an end product is the set of information needed to create a useful model of the end product. Such information includes a list of constituent parts, the relationships among these parts, the resources of the parts, user needs, and the like. Current configurators are largely end-products in themselves that are sold to the vendor.

The drawback to these configurators, from the standpoint of the vendor, is the investment of time and money that is necessary to create them. The vendor usually contracts with programmers—either independent consultants or internal employees—that must spend time learning the products of the vendor and typical external and internal needs comprising and end product. This process can be a time consuming task for the vendor—time necessary for the vendor to teach the programmer. Additionally, the expense in wages and opportunity costs in creating the configurator represent a considerable investment.

Another drawback is the inflexibility of the final configurator design. Once coded, the configurator embodies a certain amount of knowledge of the vendor's products. If a change is made to vendor's product line (or if external needs of the customer or internal needs of the constituent parts change), it may require another substantial investment of the vendor to update the configurator. Without the ability to make easy extensions to the configurator, its static and complex nature make it difficult for the configurator to keep up with such changes.

Thus, there is a need for a system (i.e. a "configurator generator") that allows vendors themselves to construct their own configurators without the need for expert programming services. Additionally, there is a need for such a system to allow for easy editing and extension of any vendor-created configurator.

It is therefore an object of the present invention to produce a system that allows for vendors to create their own configurators using easily understood graphical interfaces.

It is another object of the present invention to produce a configurator generator that has easy editing facilities to allow the vendor to update information concerning end products, external customer needs, and internal part needs.

SUMMARY OF THE INVENTION

In summary, the present invention is a novel system (a "configurator generator") that allows the user to create, modify, or delete a configurator using templates. Once the configurator is constructed, the present invention allows the user to generate specific configurations using the constructed configurator.

Templates are objects that are created by the configurator generator and recognized and used by the configurator to create configurations. Templates are stored in a persistent storage area of the configurator generator and are recalled when a change or deletion to the resulting configurator is desired.

The configurator generator provides the user with a simple, intuitive, and computer assisted way of producing or modifying templates. A user defines a specific domain that describes an end product through a graphical interface of the system thereby creating a set of templates. The system then takes the user-defined templates to create configurations of the end product.

One advantage of the present invention is the ease of constructing user-customized configurator. By creating a easy-to-use graphical interface, the present invention forgoes the requirement of utilizing expensive programmers to create configurators. Vendors of different end products may use the present invention to create complete configurators themselves. Additionally, vendors may employ non-programmers (e.g. engineers, marketeers, and the like) to produce configurators for different classes of end products in the course of their normal employment.

Another advantage of the present invention is the ease of modifying existing configurators. When a vendor has changed end products (or there arise new or different external, customer needs or internal part needs), the templates from which the configurator was constructed may be recalled from storage to be changed. The changed templates may, then, be used by the configurator generator to create configurators that reflect changed products or needs.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

GENERAL OVERVIEW/CONFIGURATION EXAMPLE

Figure 1:
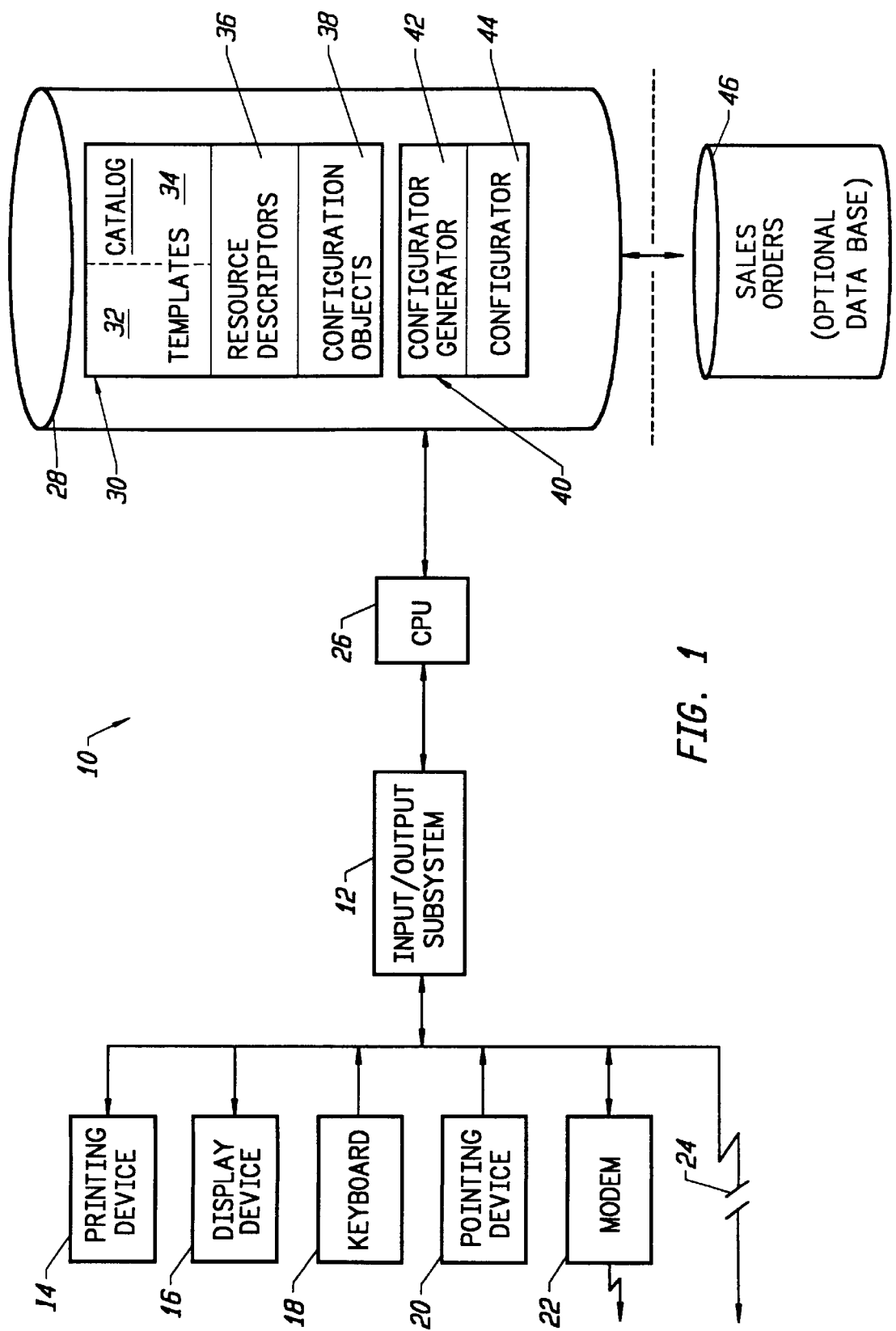
FIG. 1 is a high level block diagram of the configurator generator made in accordance with the principles of the present invention.

Referring to FIG. 1, a high level block diagram is shown of the configurator generator system 10 made in accordance with the principles of the present invention. System 10 broadly comprises input/output subsystem 12, central processing unit (CPU) 26, and storage 28. Input/Output subsystem 12 allows the user to interact with the configurator generator and create or modify configurators. Suitable input/output devices connected to subsystem 12 include; but are not limited to, a printing device 14, a display device 16, a keyboard 18, and a pointing device 20 (e.g. a mouse or the like), a modem 22, and a network connection 24.

These input/output devices are coupled, through subsystem 12, to CPU 26. CPU 26, under control of software modules 40, allows the user to create domain-specific configuration systems with the presently claimed configurator generator.

Storage 28, coupled to CPU 26, stores a variety of control items 40 and data items 30. Data items 30 in storage 28 comprise templates 34, resource descriptors 36, and configuration "trees" 38. In one embodiment, these data items are created and stored in a commercially available persistent object store, such as POET produced by POET Software. Persistent object storage provides a pre-defined set of routines for storing and retrieving objects while preserving their data structure. As an additional, optional storage area, a sales order database 46 may be accessible to the configurator where the items comprising a configuration would be stored as sales order items.

As will be discussed in greater detail below, "templates" are internal, system-defined objects containing data supplied by the user that represent the various parts in a product configurator. Certain templates are designated as belonging to the "Catalog" 34. These catalog templates are the starting point templates (i.e. the "root" of a configuration tree) for configurable products—the configuration process begins with the selection, by the user, of a Catalog template.

Control items 40, stored in storage 28, comprise the configurator generator module 42 and the configurator module 44. The configurator generator module 42 is invoked by the user to create a given configurator by creating a set of templates describing a particular product domain. Once the configurator is constructed, the user then may invoke the configurator module 44 to create particular configurations of a particular product.

To gain a better understanding of the process of creating a given configuration using the present invention, a simple example of a configurator of a personal computer will be used for illustration sake. It will be understood, however, that the configurator generator may be used in a wide variety of product domains and that the present invention should not be limited to the particular domain of a personal computer system.

Figure 2:
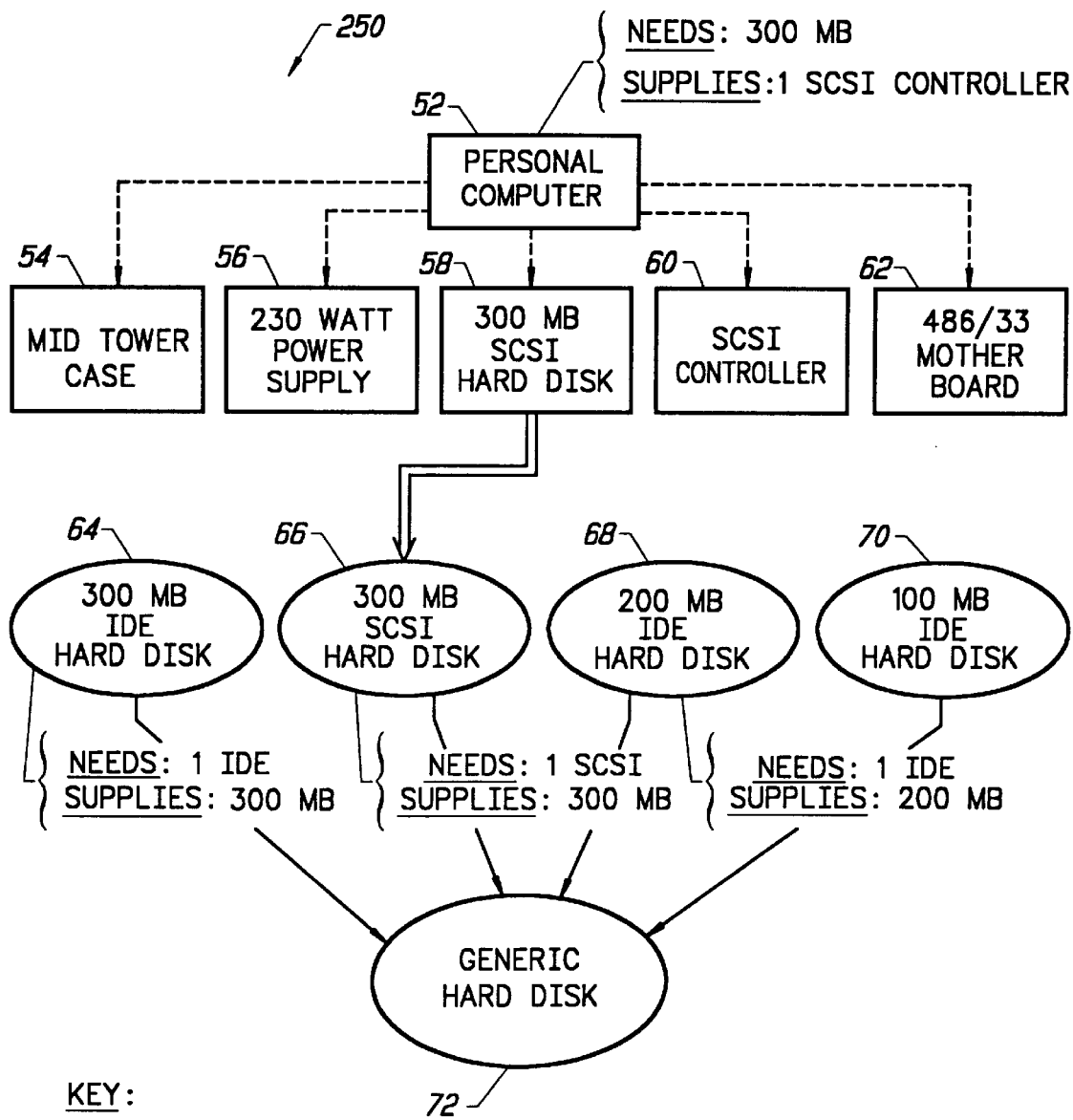
FIG. 2 is an example of a configuration of a personal computer based upon external, user-supplied needs and internal parts needs.

FIG. 2 depicts a possible personal computer system configuration model 50 based upon external, user-supplied needs and internal parts needs. Model 50 could be constructed by a configurator after sufficient information concerning the composition of a personal computer and the customer's desires for a computer have been supplied to the configurator. The end-product, personal computer 52, is shown as a subassembly of many parts: a mid tower case 54, 230 watt power supply 56, 300 MB SCSI hard disk 58, a SCSI controller 60, 486/33 motherboard 62, among other components (not shown).

FIG. 2 is a completed model in so far as each of the constituent parts of the personal computer 52 is an "instantiatation" of an actual part. Initially, however, the model would have parts that are instantiatations of "generic" parts. These generic parts are replaced by actual parts by a process called "refinement". During refinement, substitution of actual parts for generic parts is governed partly by the internal and external constraints and needs that must be satisfied. The parts in FIG. 2 are joined to the top-level personal computer part 52 by "is-a-subassembly-of" relations to denote that they are constituent parts of the personal computer 52.

These constituent parts are, in turn, members of a "class" of objects having similar features. For example, the 300 MB SCSI Hard Disk part 58 is a member of the class "300 MD SCSI Hard Disk" 66. Class 66 is, in turn, a subclass of class "Generic Hard Disk" 72, as are subclasses 64, 68 and 70. This subclass relationship (e.g. "is-a" relation) is denoted by the solid arrows in FIG. 2.

Another aspect depicted in FIG. 2 is the satisfaction of both external and internal needs in order to instantiate parts for a particular configuration. As seen in FIG. 2, the personal computer 52 "needs" 300 MB of disk storage. This "need" may be user-supplied as the desired amount of storage for a customer's system. To help meet that need, the personal computer 52 "supplies" one SCSI hard disk controller 60. Thus, during the process of refining the generic hard disk part, the configurator searches for a subclass of class Generic Hard Disk 72 that meets the need for 300 MB storage. Both the "needs" and "supplies" field of a given part class represent the constraints (or "resources") of its member parts.

During the process, the system might consider a member of class 300 MB IDE Hard Disk 64 as a possible candidate for refinement. Although these hard disks do supply 300 MB of storage as needed by personal computer 52, it has an internal need of its own—namely, an IDE hard disk controller. Because personal computer 52 does not supply an IDE controller, the internal need of such a hard disk is not satisfied and the configurator module 44 does not select it as a final instantiated part.

On the other hand, hard disk 58 of class 300 MB SCSI Hard Disk 66 supplies 300 MB of storage as needed by the personal computer 52 and personal computer 52 supplies one SCSI controller 60 as needed. Thus, both external and internal needs are satisfied by hard disk 58 and the configurator module 44 thus instantiates hard disk class 66 to produce instantiated hard disk part 58 and inserts it into the final configuration of personal computer 52.

As a general rule, a part cannot be placed in a configuration if its needs are not satisfied by the resources that the configuration supplies. Likewise, a part cannot be placed in a configuration if the resources it supplies do not meet the configuration's needs for those resources. At any given time in the configuration process, a configuration's needs are the sum of the needs of all its constituent parts less the resources supplied by its parts. It will be appreciated that most of these constraints are easily evaluated arithmetic inequalities.

It will be now be discussed how the presently claimed configurator generator allows a user to define the various objects (i.e. parts of a particular end product) necessary to create a configuration system for a given product domain.

TEMPLATES AND RELATED OBJECTS

In the present invention, the user creates the desired domain through a graphical process of supplying data to be stored in the various objects of the domain. The objects used by the configurator generator have a common layout regardless of domain. The various objects (or parts) for which the user supplies data are "templates".

In short, templates are objects that describe to the constructed configurator how to construct other objects. Generally, every class of part that makes up a domain model is represented by a template. Templates may be created, modified or deleted by the user. After creation or modification, the template is stored in the template store 34 shown in FIG. 1. The following tables describes the data structure of a template as currently embodied:

TABLE 1—TEMPLATES

A template representing a given part comprises the following user supplied fields:

- a part number: a alphanumerical value;
- a model number: a alphanumerical value;
- the part's superclass, if any: a reference pointing to the template representing the superclass of the part;
- the part's subclasses, if any: a set of references pointing to templates representing the subclasses;
- the part's attributes, if any: a set of attribute entries;
- the part's subassemblies, if any: a set of subassembly entries;

the part's supplied resources, if any: a set of resource entries;

the part's needed resources, if any: a set of resource entries.

Attribute Entries comprise:

the attribute's name: alphanumeric;

the attribute's type: integer type;

the attribute's value: the date type is exprVal (exprVal is a polymorphic type whose values may be either a number, a value set or a range).

Subassembly Entries comprise:

a part number: a numerical value;

the number of instances of the part comprising the subassembly: exprVal;

a Boolean value indicating whether the subassembly is "immediate" (An "immediate" subassembly is a procedure which is executed at the time a configuration is being constructed. Such procedures can display messages to the operator using the configurator.).

Resource Entries comprise:

the resource name: alphanumeric;

an expression that is evaluated when a part is instantiated to yield a value of type exprVal. This value is the quantity of the resources supplied or needed.

CONFIGURATION GENERATOR MODULE/ CREATING PART TEMPLATES

The present claimed configurator generator allows the user to create a product domain by specifying a "part template" for every part comprising the end product. These part templates describe both the generic and the specific parts comprising said product. Once the part templates are defined, the configurator creates instantiated part objects during the process of constructing a configuration.

It will be appreciated that the data structure representation of templates and instantiated parts is internal to the configurator and hidden from the user. The configurator generator supplies the user with a graphical interface through which the user supplies the configurator generator with enough information to generate those internal data structures.

Figure 3A:
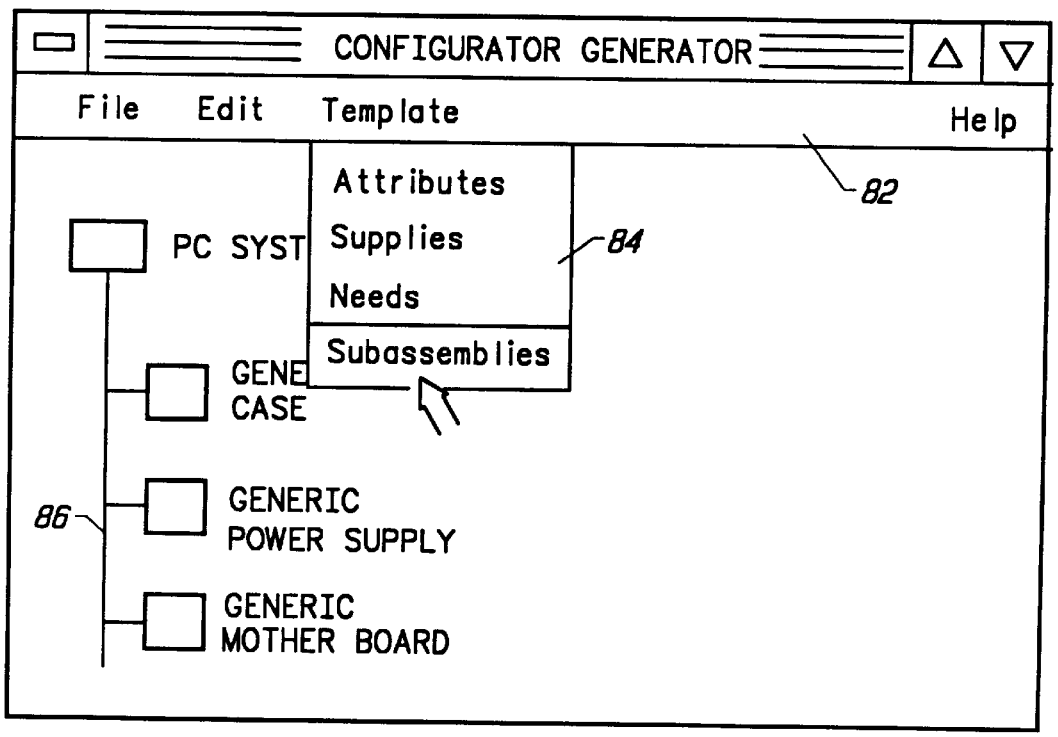
FIGS. 3A–3C depict how a user would provide the configurator generator with sufficient information to create a template for a generic hard disk for the personal computer subassembly.
Figure 3B:
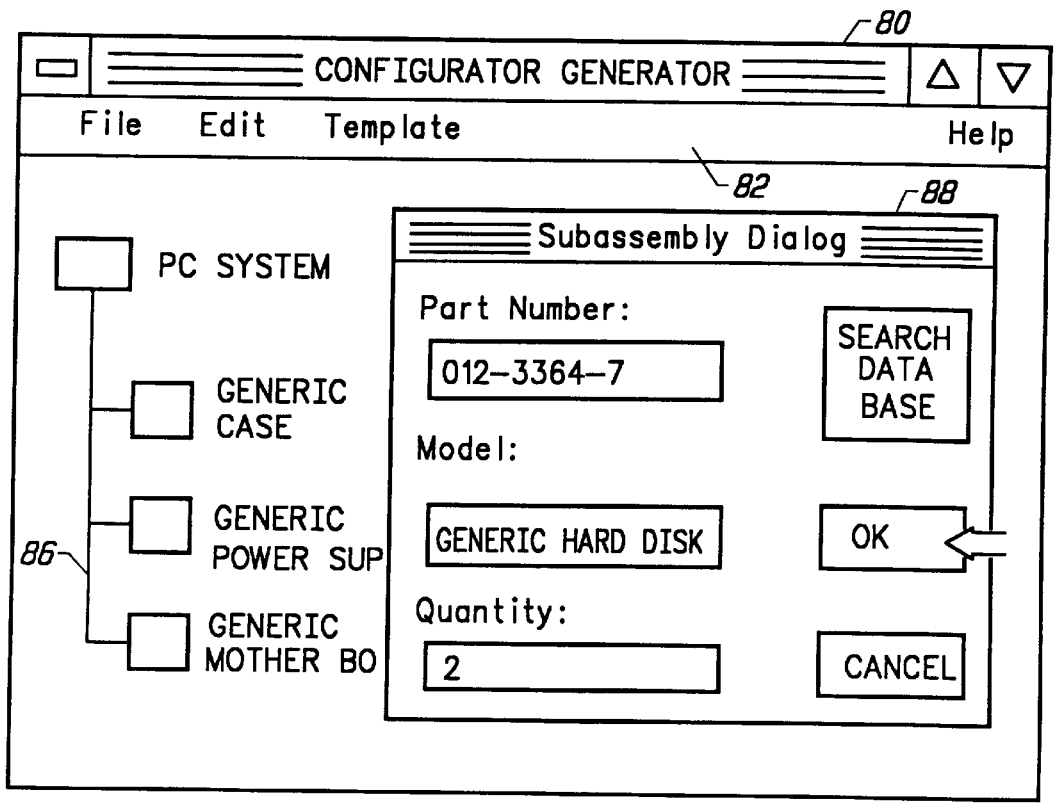
Figure 3C:
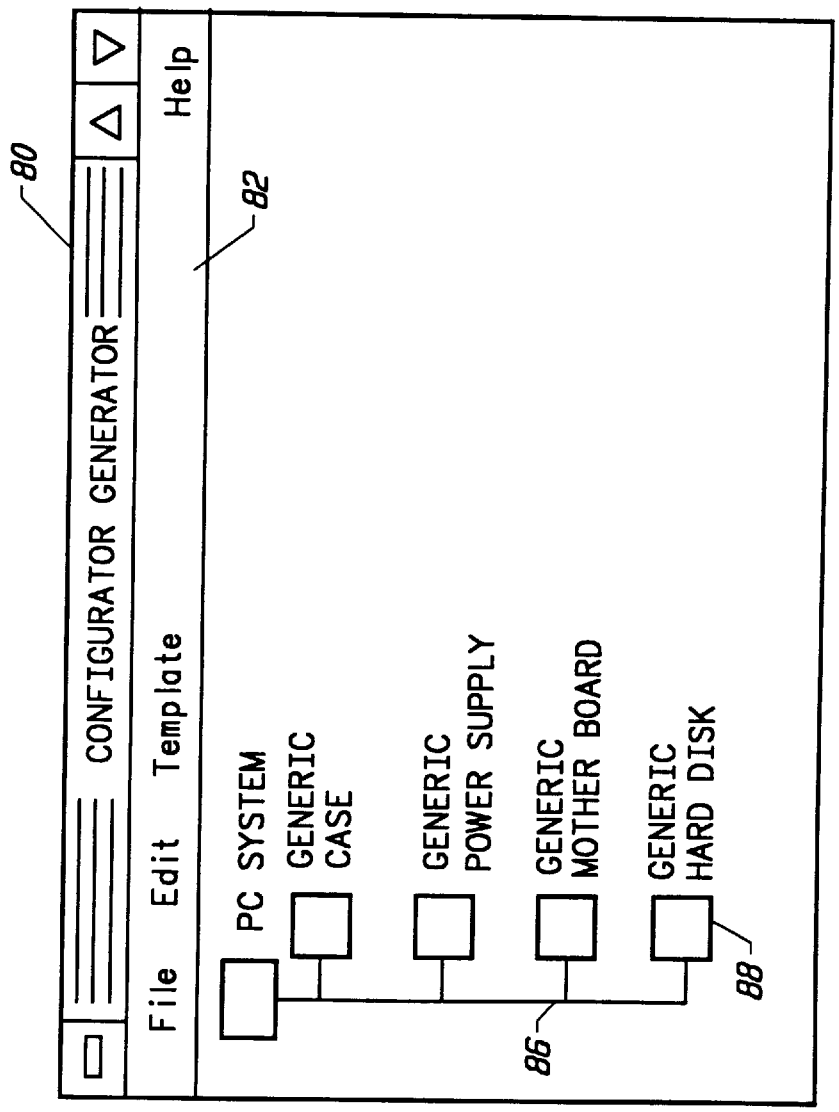

FIGS. 3A–3C depict how a user would provide the configurator generator with sufficient information to create a template for a generic hard disk for the personal computer subassembly. Screen 80 is a graphical interface similar to those generated by a Windows application. Menu 82 gives the user a number of command possibilities, any one of which may have a pull down menu (such as menu 84). In FIG. 3A, the user selects the Subassembly option of the Template command to create a subassembly part. In FIG. 3B, a dialog box 88 appears, presenting the user with several fields to fill in. After the user is finished, the configurator generator creates a part template for the generic hard disk and displays the generic hard disk 88 as appended onto the personal computer configuration 86, as shown in FIG. 3C.

Figure 4:
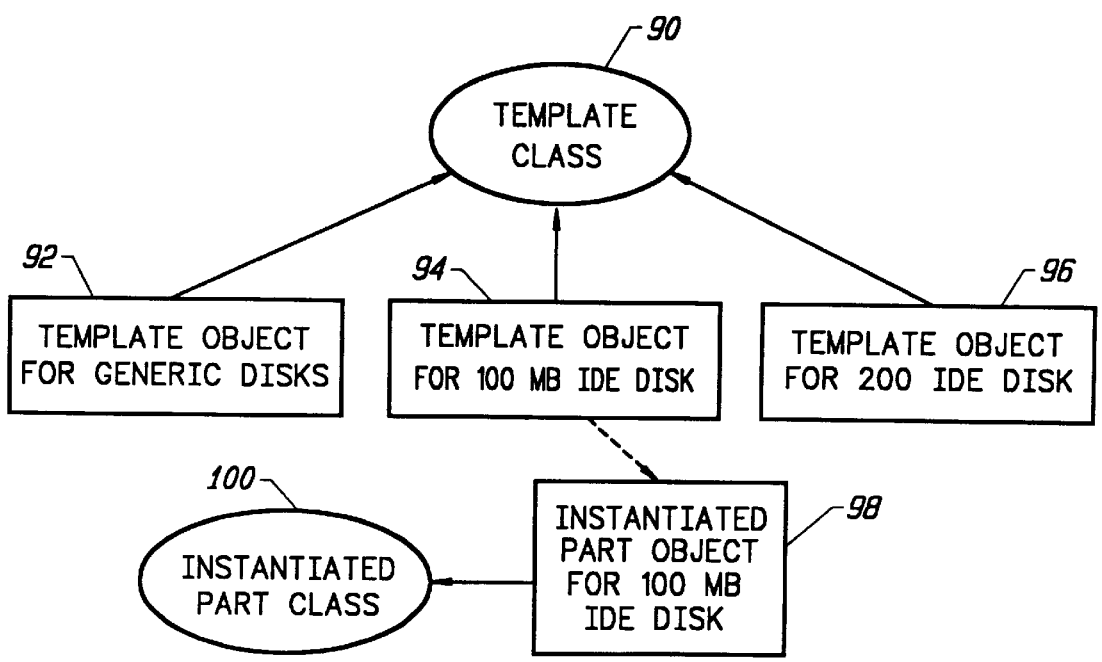
FIG. 4 shows the template objects that represent various part classes of a personal computer, including hard disk classes.

Continuing with the personal computer configurator example in FIGS. 2 and 3A–3C, FIG. 4 shows the template objects that represent various part classes of a personal computer, including hard disk classes. Also shown in FIG. 4 are template class 90 and instantiated part class 100. The current embodiment of the present invention provides these classes internally to the system and hides them from the user. Template class 90 and instantiated part class 100 are stores of methods that are common to all templates and instantiated part objects. The following is a description of the various methods found in the template class and instantiated part class:

TABLE 2—TEMPLATE CLASS AND INSTANTIATED PART CLASS METHODS AND RELATED OBJECTS

TEMPLATE CLASS METHODS

1. Create template. Argument is Part Number.
2. Delete template.
3. Get super class: returns a reference to the template for this part class's superclass, if it has one.
4. Get Attribute Set: returns a pointer to this template's attribute set.
5. Get supplied resources set: returns a pointer to this template's supplied resources set.
6. Get needed resources set: returns a pointer to this template's needed resources set.
7. Get subassembly set: returns a pointer to this template's subassembly set.
8. Get subclasses set: returns a pointer to this template's subclasses set.

INSTANTIATED PART CLASS METHODS

1. Create instantiated part object. Arguments are a template, a pointer to the part object's container, if it has one, and a quantity value of type exprVal.
2. Delete instantiated part object.
3. Create instantiated part objects for all the current part's subassemblies.
4. Get needed resources value set: returns a pointer to this Instantiated Part Object (IPO)'s needed resources value set.
5. Get supplied resources value set: returns a pointer to this IPO's supplied resources value set.
6. Find the subassembly that supplies a resource needed by this IPO. Argument is a resource name.
7. Get superclass object: returns a pointer to the IPO for this IPO's superclass.
8. Get refinement set object: returns a pointer to the refinement set associated with this IPO, if this IPO represents a generic part.
9. Set refinement set object: associates this IPO with a refinement set object.
10. Get refining object: if this IPO represents a generic part, returns a pointer to the object(s) in the configuration tree that currently refine it.
11. Set refining object: associates this IPO with the objects that refine it.
12. Set subassembly: adds an IPO to this IPO's subassembly set.
13. Get container: returns a pointer to this IPO's container.
14. Set container: associates this IPO with its container.
15. Get template: returns a pointer to the template from which this IPO's was created
16. Get next IPO: if this IPO is part of a refinement involving more than 1 IPO, returns a pointer to the next IPO in the refinement list.
17. Set next IPO: adds an IPO to a refinement list in the position immediately following this IPO.
18. Get display object: returns the display object associated with this IPO.
19. Set display object: associates this IPO with a display object.

REFINEMENT OBJECTS

1. Create refinement object. Argument is the list of IPOs constituting the refinement this object is to represent.

2. Delete refinement object.
3. Get attribute set: returns a pointer to the refinement object's attribute set.
4. Get the head of the IPO list: returns a pointer to the IPO at the head of the list of IPOs constituting the refinement this object represents.
5. Set the IPO list: associates a new IPO list with this refinement object.
6. Get resource store: returns a pointer to the resource store associated with this refinement object.
7. Combine refinement objects: the argument is a refinement object. Combines this refinement object with the argument to make a new refinement which includes the IPOs of both and merges their attribute sets and resource stores.
8. Check supplied resources: argument is the resource store for a configuration. Check the supplied resources in this refinement object's resource store with the needed resources in the configuration's resource store.
9. Check needed resources: argument is the resource store for a configuration. Check the needed resources in this refinement object's resource store with the supplied resources in the configuration's resource store.
10. Attribute comparison: arguments are a refinement object and an integer index. Compares this refinement object with the argument refinement object with respect to the attribute at the index.
11. Get description: returns a string describing this refinement (i.e. a list of the part numbers of the parts comprising it).
12. Get inadequate resource: returns a character string giving the name of the resource needed by the parts comprising this refinement that the configuration currently doesn't supply enough of.

REFINEMENT SET OBJECTS

1. Create refinement set object. Arguments are a pointer to the IPO for the generic part being refined and a pointer to the current configuration object.
2. Delete refinement set object.
3. Get selected refinement. Argument is an integer index indicating the selected refinement. Updates the configuration tree with the selected refinement. If the selected refinement is on the reconsider list, it tries to adjust the configuration to accommodate the selected refinement.
4. Find next refinement. The currently selected refinement no longer supplies an adequate amount of some resource; find the next largest refinement that does and place it in the configuration.
5. Check the reject list. Checks this refinement set object's reject list for a smaller refinement that satisfies the current configuration's resource requirements, which have been reduced due the user changing the configuration.
6. Make and classify all refinements of size N.

CONFIGURATION OBJECTS

1. Create a configuration object.
2. Delete a configuration object.
3. Update resource store. Argument is a refinement object's resource store. Update the configuration object's resource store to reflect the contents of the argument.
4. Undo resource store update. Argument is a refinement object's resource store. Reverses the effect of 3.
5. Update configuration tree. Argument is a pointer to the IPO for a generic part. Replaces the argument IPO in the configuration tree with its currently selected refinement.
6. Undo configuration tree. Argument is a pointer to the IPO for a generic part. Reverses the effect of 5.
7. Update attributes. Argument is attributes set from an IPO.
8. Undo attributes. Argument is attributes set from an IPO.
9. Set root instantiated part object. Argument is an instantiated part object.
10. Get root object. Returns the instantiated part object at the root of the configuration tree.

It will be appreciated that the above mentioned methods are easily implemented by the built-in set class and its operations that are provided by a commercially available persistent object store. Such built-in operations include: methods for creating sets, adding elements to sets, deleting elements, searching for elements based on values stored in the elements, and getting the "next" element from a set, among others.

As seen from their description above in Table 2, both template class 90 and instantiated part class 100 have methods for creating members of their respective classes. Thus, in FIG. 4, the configurator generator invokes the template creation method to create template objects 92, 94, and 96 during the process of creating the product domain thus defining the properties of the various hard disk parts making up the end product. As mentioned above, the information that comprises the various data fields of a template object is supplied by the user. The user is presented graphically with the potential attributes and properties of the part being described and can make choices among those possibilities. The user may be aided in their choices by prompts in the form of dialog boxes, menus, or the like.

CONFIGURATIONS AND RELATED OBJECTS

Once the template objects have been created and stored in template storage 34, the user may invoke the configurator to create configurations by instantiating a part object from the Catalog and then refining the resulting configuration tree until all its instantiated generic parts have been replaced by instantiations of their subclasses.

The following is a description of the objects that are used in creating a configuration:

Table 3—OBJECTS USED IN CREATING A CONFIGURATION

Instantiated Parts
  instantiated parts represent the actual parts comprising an end product. The internal data structure of an instantiated part comprises:
  1. A reference to the part's container, if any. A part's container is the IPO of which the part is a subassembly. For example, personal computer part 52 is the container of the 300 MB SCSI hard disk part 58.
  2. A reference to the part's superclass object, if any.
  3. A reference to the next instantiated part in a refinement. The part instantiations comprising a solution (i.e. the parts that refine a generic part) are linked together. The head of this linked list is stored in a refinement object. If the solution is part of a configuration, a reference to the head of the linked list is also stored in its container's subassembly set. Thus, one can think of a configuration as a tree of solutions.
  4. A reference to the part's template.
  5. A set of objects of type exprVal representing the part's supplied resources.

6. A set of objects of type exprVal representing the part's needed resources.
7. A reference to the parts display object.
8. If the part is generic, a reference to its refinement set object (if one exists). A part is "generic" if it has no superclass and its subclass set is non-empty.
9. If the part is generic, a reference to the linked list of objects that refine it (if they exist).
10. A set of references to instantiated parts (the part's subassemblies. This set may be empty.

Resource Stores

As their name suggests, resource store objects are used to accumulate the resources supplied and needed by a configuration or refinement. A resource store is accessed associatively by a resource's name. It returns a pair of exprVal objects; one element of the pair represents the amount of the resource supplied by a configuration or refinement, the other element represents the amount of the resource supplied.

Refinement Objects

A refinement object represents a set of instantiated parts, one or more of which may potentially be substituted for a generic part in a configuration. The size of this set is determined by the quantity value in the subassembly entry for the generic part in its container. If the quantity of potential objects is n then the set will contain n elements. A refinement object includes the following information:
1. The head of the linked list of instantiated parts constituting the refinement.
2. The refinement's attributes. The data type is set of Attribute Entry.
3. The refinement's resource store.

Refinement Sets

A refinement set object represents all the possible refinements of a generic part. The number of such refinements is determined by the quantity value in the subassembly entry for the generic part in its container and the number of the generic part's subclasses. If the quantity value is n and the number of subclasses is k then the set will contain all n combinations of instantiated parts from the k subclasses with duplicates allowed. A refinement set object contains the following information:
1. A reference to the configuration to which the refinement set is attached.
2. the "Solution Set" (i.e. the set of currently viable refinements ordered according to the configuration's selector. The data type is ordered set of refinement objects).
3. The "Reconsider Set" (i.e. the set of refinements that satisfy the configuration's needs but whose own needs are not satisfied by it. This set is ordered according to the configuration's selector. The data type is ordered set of refinement objects).
4. The "Reject Set" (i.e. the set of refinements that do not satisfy the configuration's needs. This set is ordered according to the configuration's selector. The data type is ordered set of refinement objects.
5. A list of configuration tree nodes used for book-keeping purposes by some of the configuration algorithms.

Configuration Objects

Configuration Objects represent configurations of a product. They serve two purposes. During the configuration process they contain, among other things, the root of the current configuration tree and thus provides the means by which the Configurator accesses that tree. Secondly, they may be stored in and recalled from the storage. This allows the user to store a partially completed configuration to be worked on later. Configuration Objects contain the following information:
1. The identifier by which the Configuration is known in the storage.
2. The configurations attribute set (which is computed from the attributes of its constituent parts).
3. The index in the attribute set of the configuration's primary selector.
4. The index in the attribute set of the configuration's secondary selector.
5. The configuration's resource store.
6. A reference to the instantiated part object at the root of the configuration tree.

Figure 5:
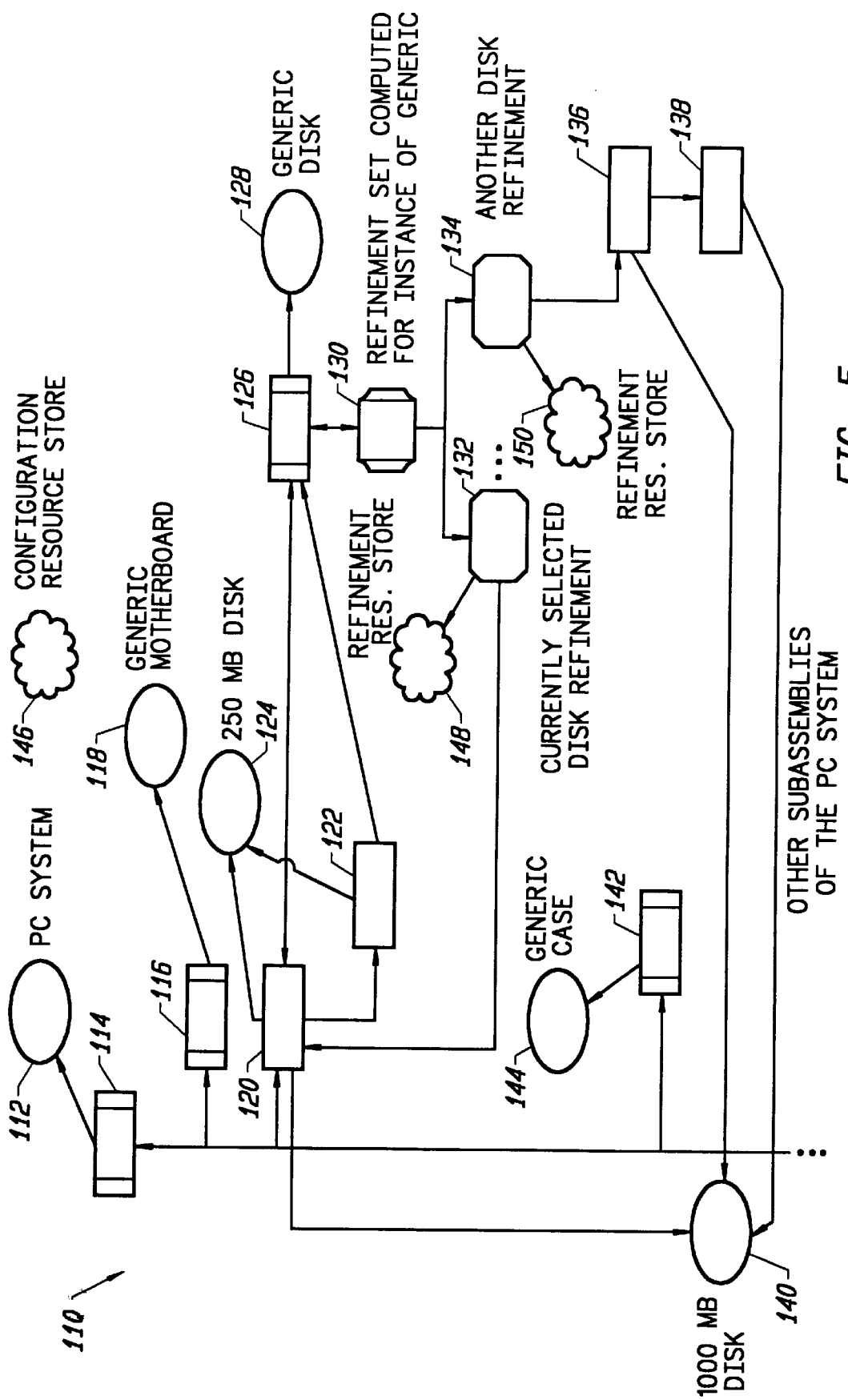
FIG. 5 depicts a possible configuration after the refinement of the generic hard disk for the personal computer configuration 110.

FIG. 5 depicts a possible configuration after the refinement of the generic hard disk for the personal computer configuration 110. Configuration 110 is represented by instantiated generic personal computer (PC) part 114 which points to its class PC System 112. PC part 114 comprises a number of subassemblies such as instantiated generic motherboard part 116 (shown pointing to class "generic motherboard" 118), instantiated generic case 144 (pointing to class "generic case" 144), and specific hard disk parts 120 and 122.

For this particular configuration, two 250 MB hard disks parts 120 and 122 were selected to become the actual subassembly comprising the configuration. Both parts point to their class "250 MB Disk" 124, as well as to the instantiated generic hard disk part 126 (pointing to its class 128). To arrive at this substitution, refinement set 130 was generated. Refinement set 130 comprises a number of refinements, such as refinements 132 and 134. Refinement 132 was the selected refinement as it points to the hard disk parts 120 and 122. Refinement 134, comprising two 1000 MB disks 136 and 138 (both pointing to class "1000 MB Disk" 140), was not selected.

As can be seen from FIG. 5, several resource stores are available to facilitate the refinement process. Configuration resource store 146 keeps a tab on the system's needs and resources as supplied by the subassemblies and the user. Additionally, each refinement maintains its own resource store (such as stores 148 and 150). These stores are used by the configurator to check a refinement's resources and need against the configuration's resources and needs to determine the suitability of the refinement for possible substitution.

CONFIGURATOR mODULE/CREATING AND REFINING A CONFIGURATION TREE

As mentioned above, once template objects have been created to describe the various parts of an end product, the user can create particular configurations of it. This process begins by the user choosing a part class from the Catalog. One embodiment of the invention is based upon a personal computer or workstation windowing system such as Microsoft Windows or OSF Motif, therefore the user controls the Configurator by means of menu selections, pointing and clicking in list of alternatives with the pointing device and typing text in form fields using the keyboard. To begin constructing a configuration, the user selects an appropriately labelled menu item. The Configurator's graphical interface then presents the user, in a dialog box, with a list of Catalog items from which the user makes his or her selection using the pointing device or keyboard. The Configurator then creates a configuration tree for the selected part class by building an instantiated part object from its template and by building instantiated part objects for each of the templates referenced by the subassembly entries in its subassembly set.

Figure 6:
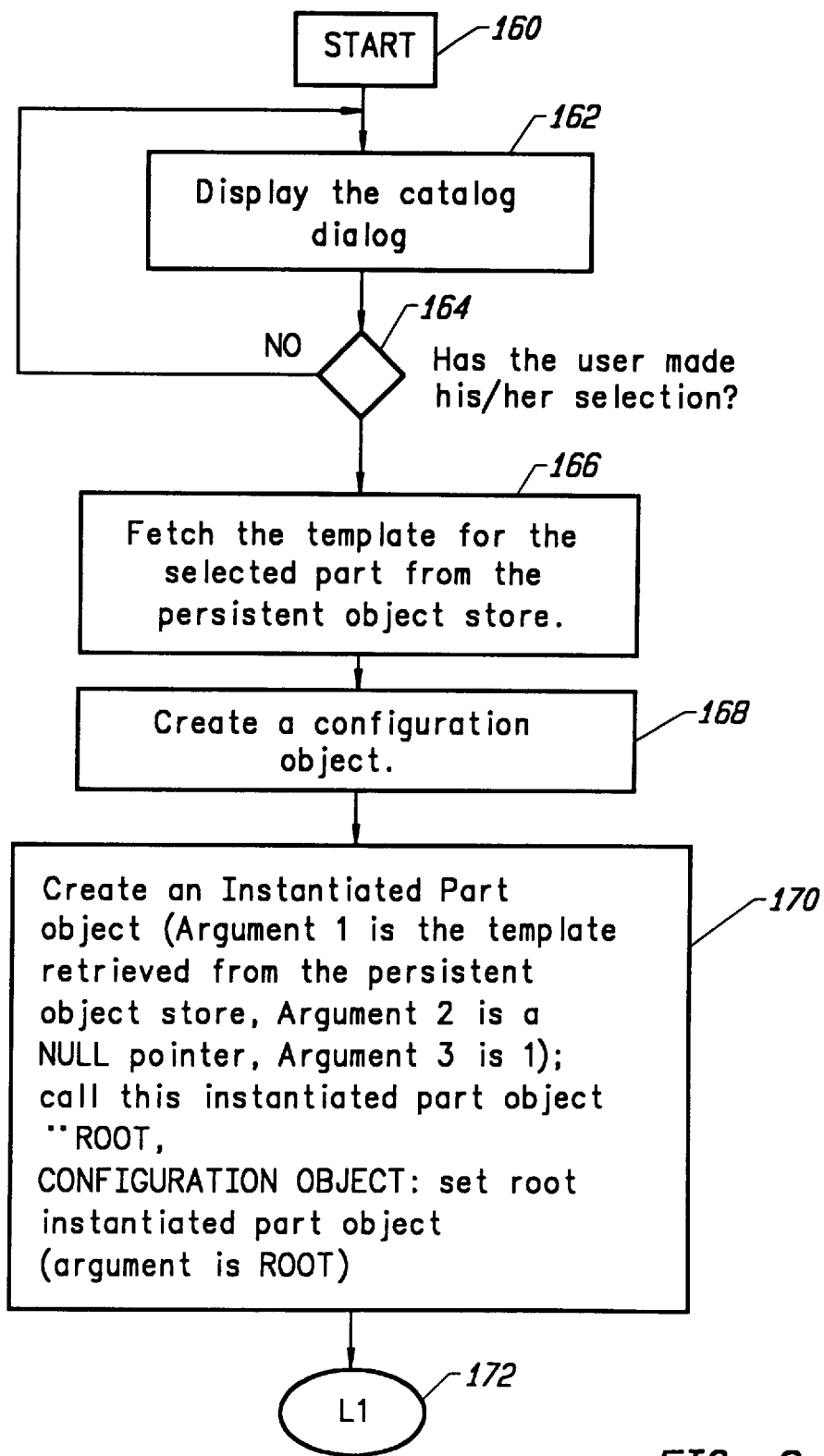
FIGS. 6 and 7 are flowcharts depicting how the user invokes the configurator and uses it to create a configuration.
Figure 7:
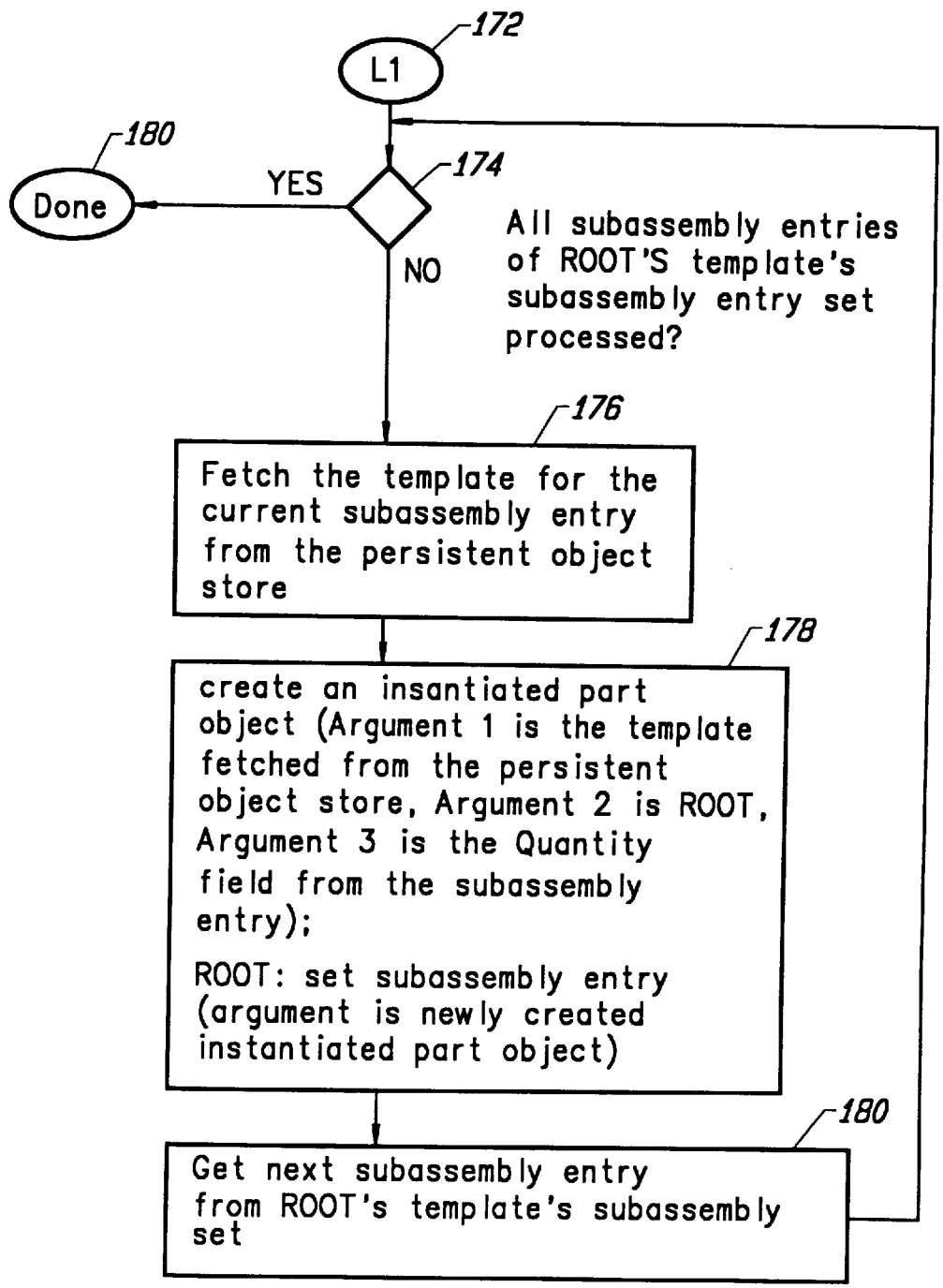

FIGS. 6 and 7 are flowcharts depicting how the user invokes the configurator and uses it to create a configuration. In step 162, the configurator displays to the user the set of catalog templates. The user selects a catalog template (such as personal computer template as the "root" template) and the configurator creates a instantiated part object from the catalog template and all of its associated subassemblies.

Figure 8:
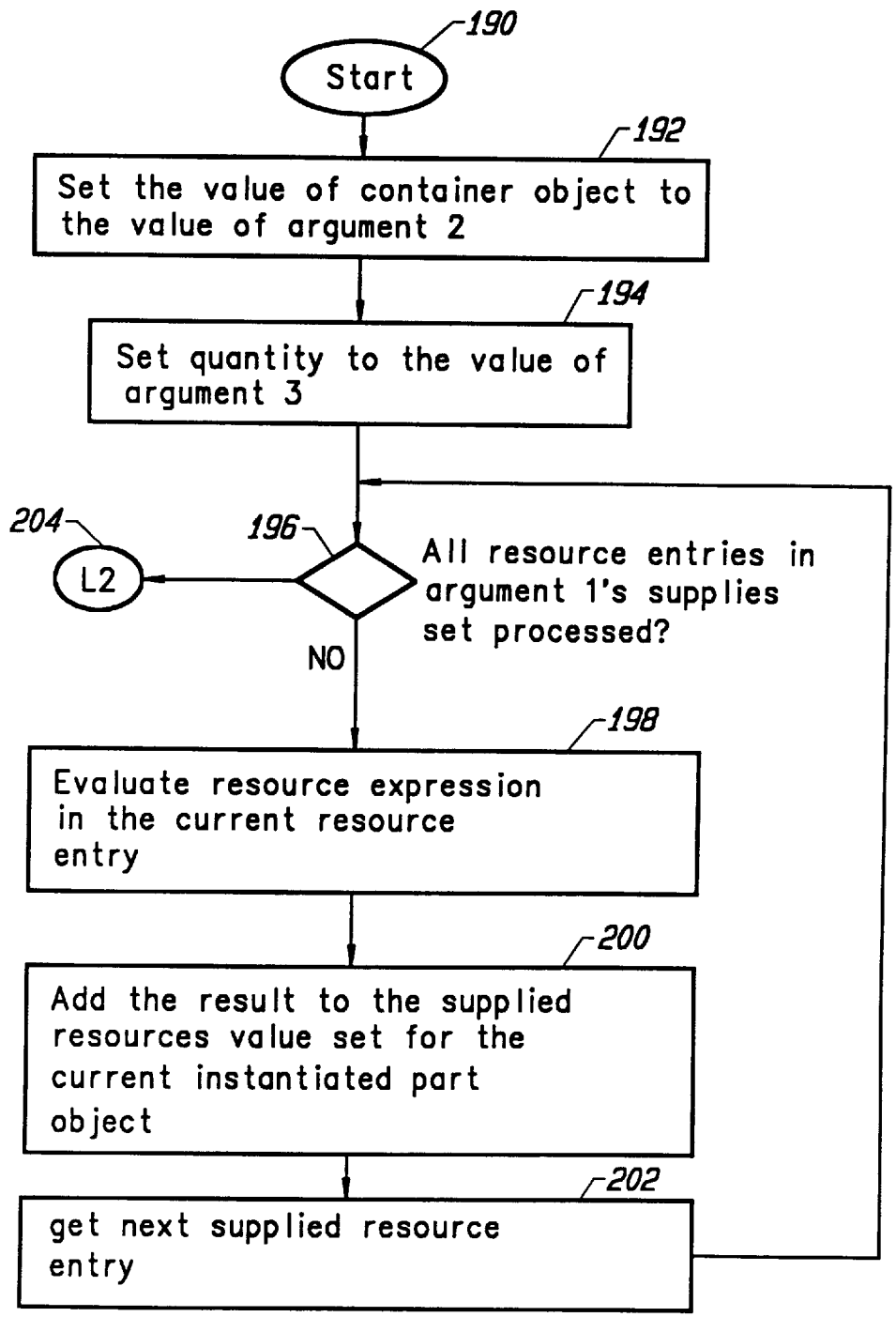
FIGS. 8 and 9 show the flowchart for creating an instantiated part object.
Figure 9:
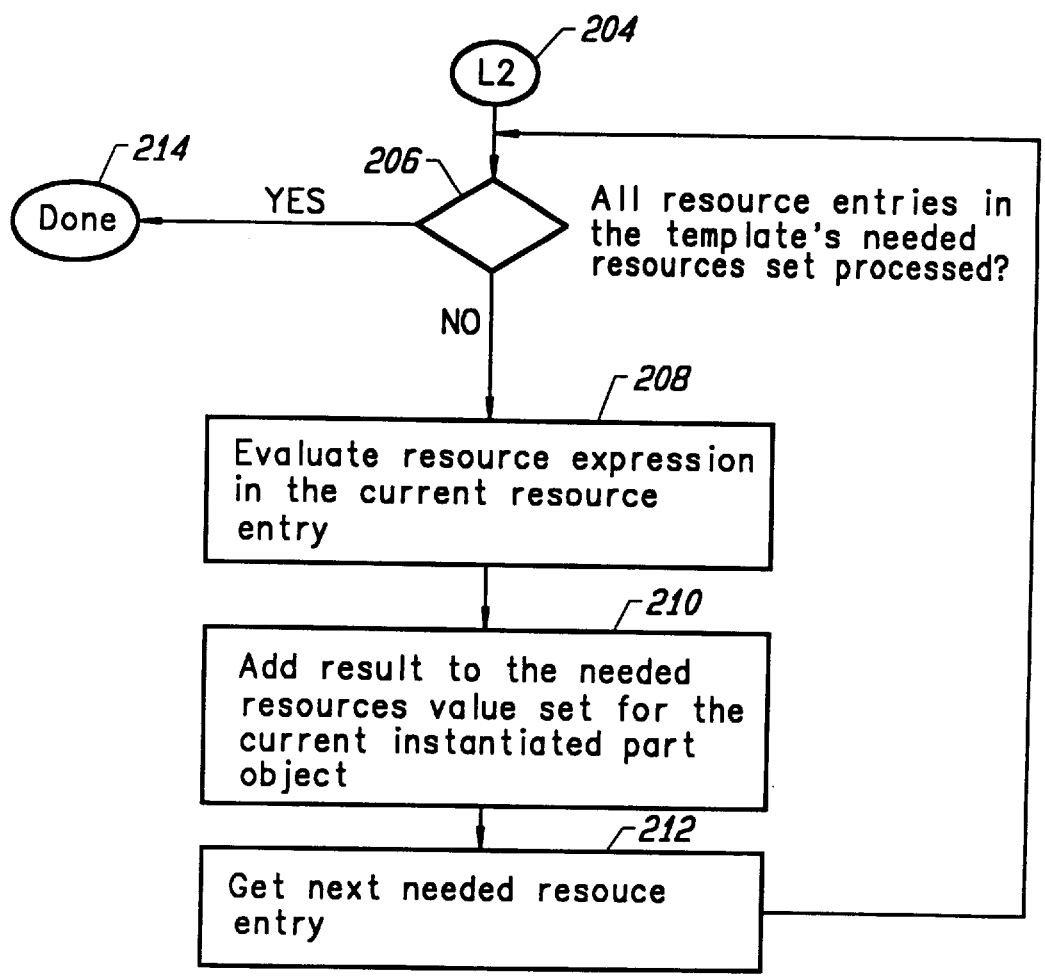

FIGS. 8 and 9 show the flowchart for creating an instantiated part object. Three arguments are passed to this routine upon invocation: 1) a template, 2) a pointer to the part's container IPO, and 3) an exprVal representing the number of copies of the part that this IPO represents. Creating an instantiated part object is invoked by several routines, including steps 170 and 178 of FIGS. 6 and 7 respectively.

It will be appreciated that this automated method of creating instantiated part objects from template objects is an important aspect of the present invention. Conventional object-oriented ways of creating configurator systems require that the user "program" each part class using source code in a programming language such as C++ or Smalltalk. Instead, the present invention allows for the automatic creation of instantiated part objects from the template objects created by the user using a graphical interface.

Once a Configuration Object and its associated configuration tree of Instantiated Part Objects have been created, the configuration must be refined. The basic operation of refinement, called a refinement step, consists of replacing the instantiated part object for a generic part with a list of one or more instantiated part objects constructed from templates for its subclasses.

Generally speaking, a Refinement Set object is created to contain all possible refinements of a particular size of the generic part undergoing refinement. Then the refinements themselves are constructed. Next the generated refinements are classified according to the current needs and supplies of the configuration. A refinement will be placed in one of three sets in the Refinement Set object:

1. If the refinement supplies an inadequate amount of some resource needed by the configuration, it is placed in the Reject Set.
2. If the refinement supplies an adequate amount of all the resources it supplies that are needed by the configuration, but its needs are not met by the configuration's supplies, it is placed in the Reconsider Set.
3. If the refinement's supplies are adequate and its needs are met, it is placed in the Solution Set.

Figure 10:
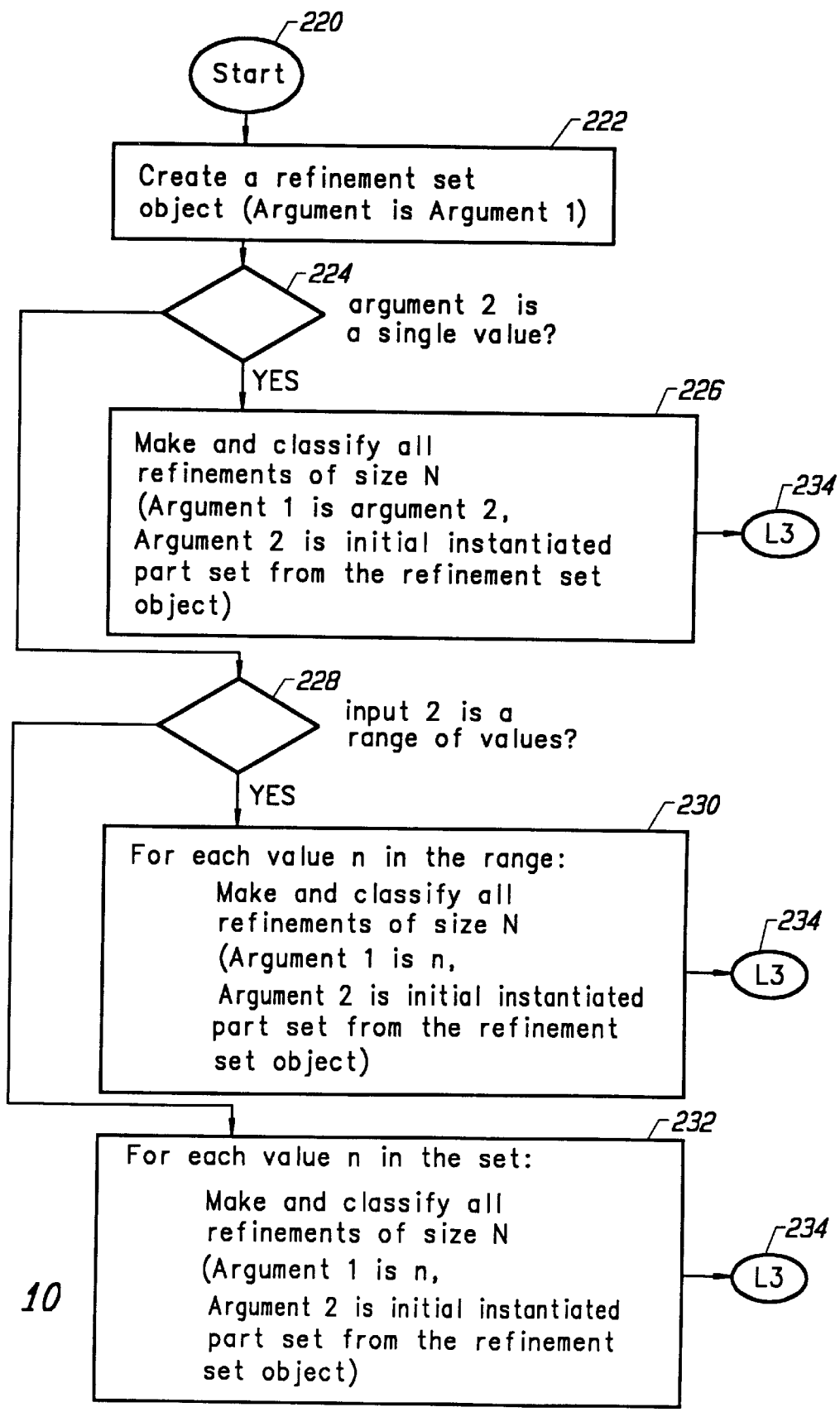
FIGS. 10, 11, and 12 show the flowcharts implementing the process of refining an instantiated part.
Figure 11:
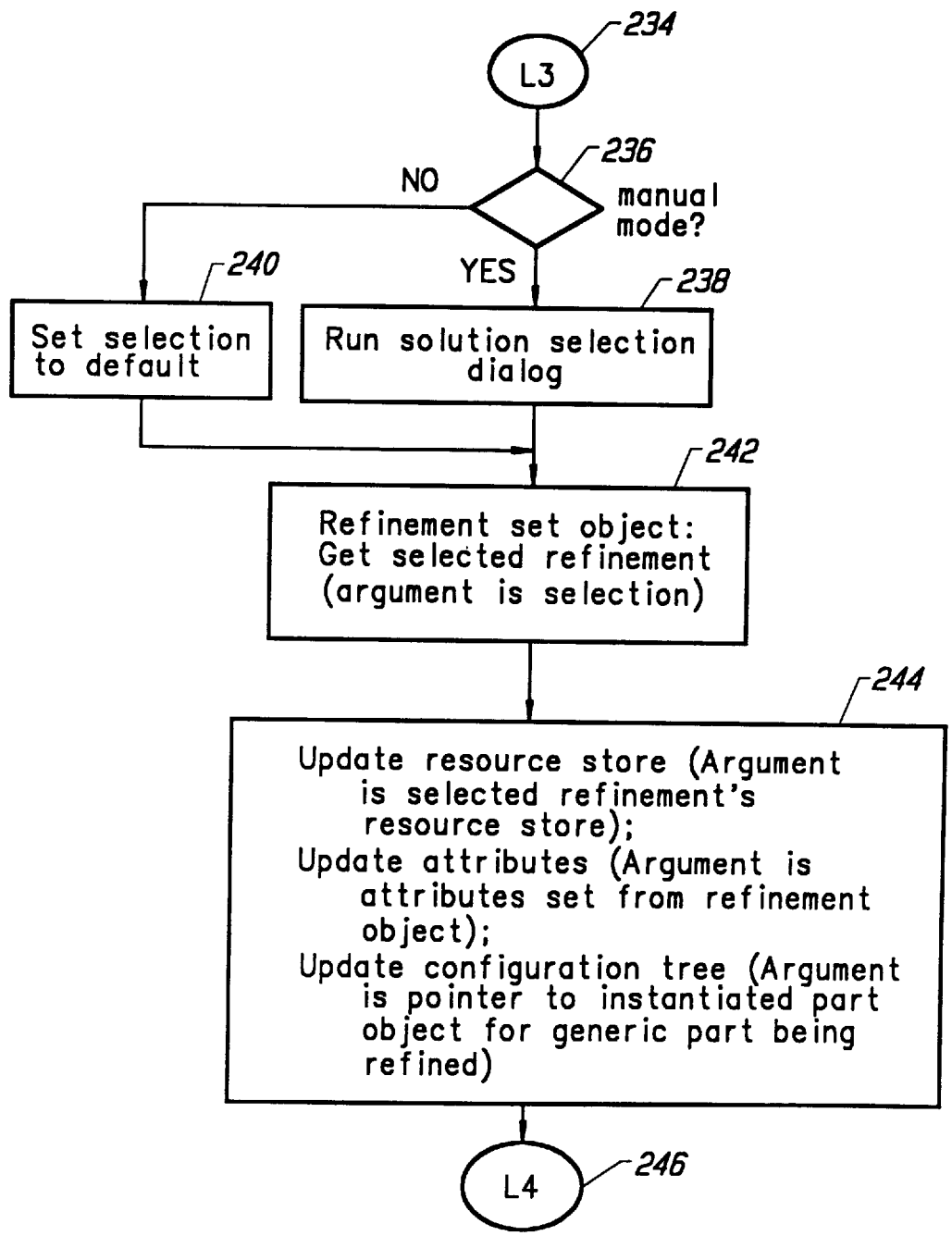
Figure 12:
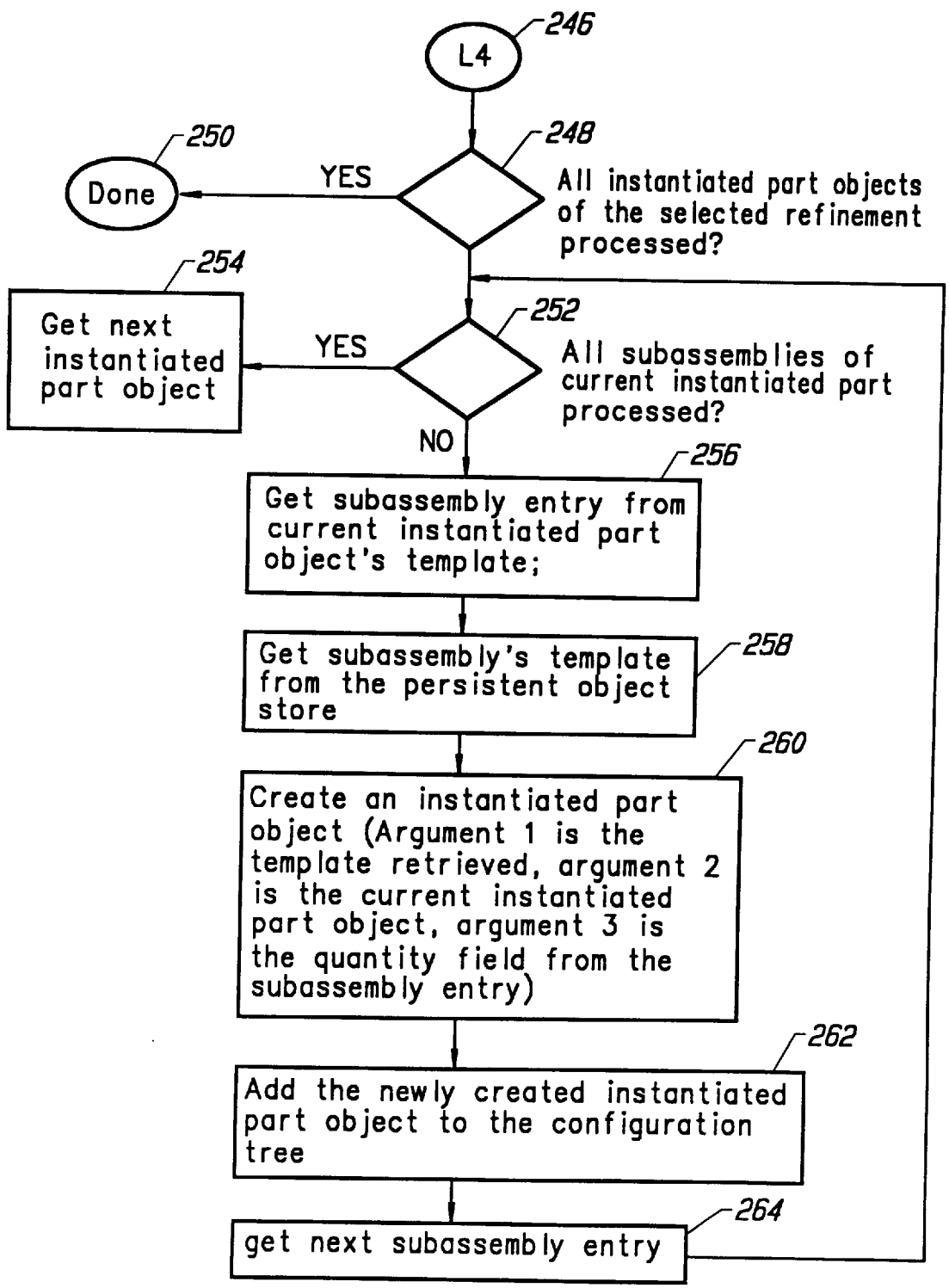

FIGS. 10, 11, and 12 show the flowcharts implementing the process of refining an instantiated part. This process is invoked by the user selecting the IPO for a generic part (with the pointing device) and choosing "refine" from the menu. This process accepts two inputs: 1) a reference to the IPO to be refined in the configuration tree, and 2) the quantity or number of the subclass parts to instantiate.

Figure 13:
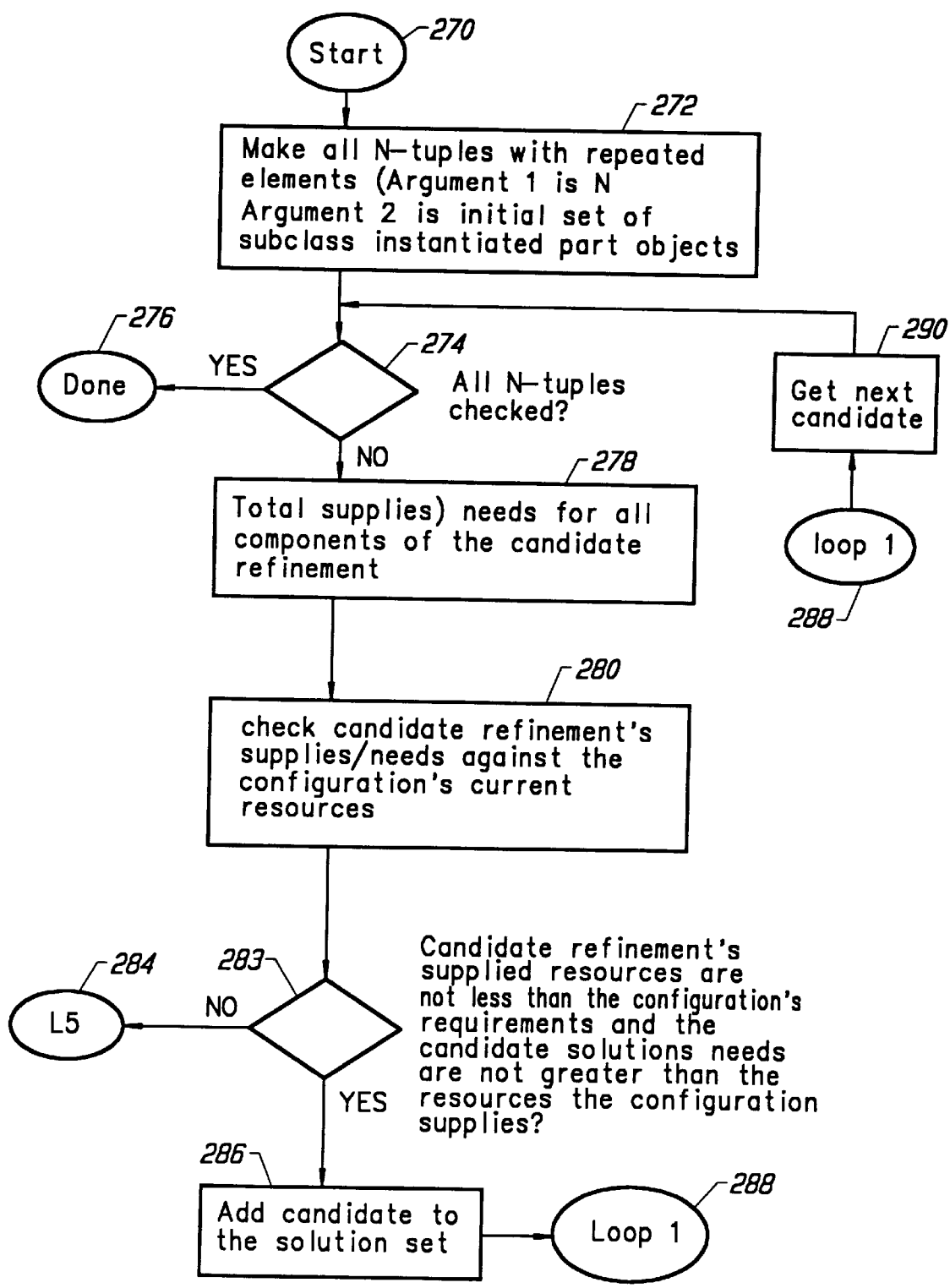
FIGS. 13 and 14 are flowchart describing the process of making and classifying refinements.
Figure 14:
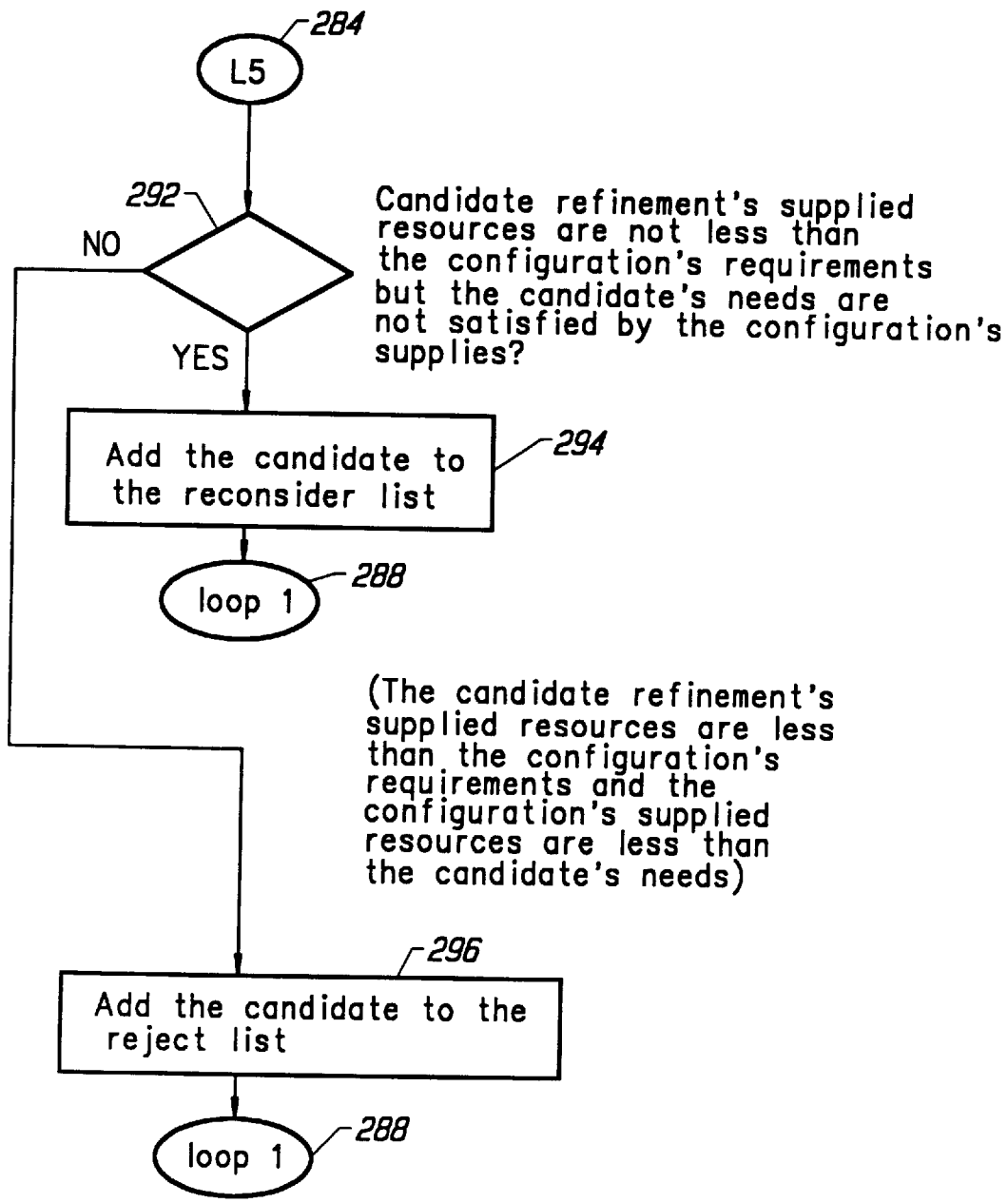

FIGS. 13 and 14 are flowchart describing the process of making and classifying refinements. This process accepts two arguments: 1) the number of instances of subclass parts to instantiate, and 2) the initial set of subclass instantiated part objects. This process is invoked by several processes, including steps 226, 230 and 232 of FIG. 10.

Figure 15:
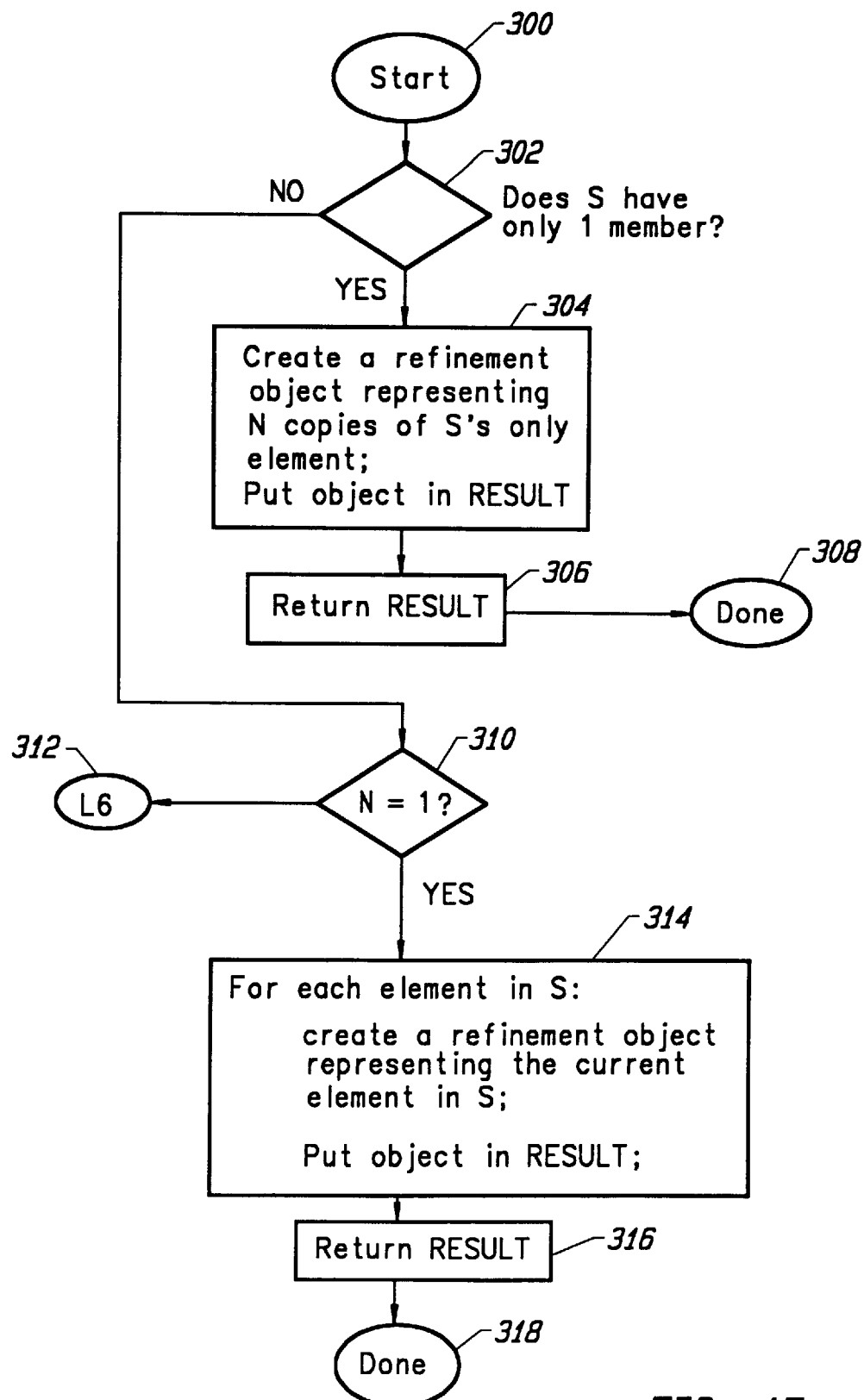
FIGS. 15 and 16 show the recursive process of making all n-tuples with repeated elements.
Figure 16:
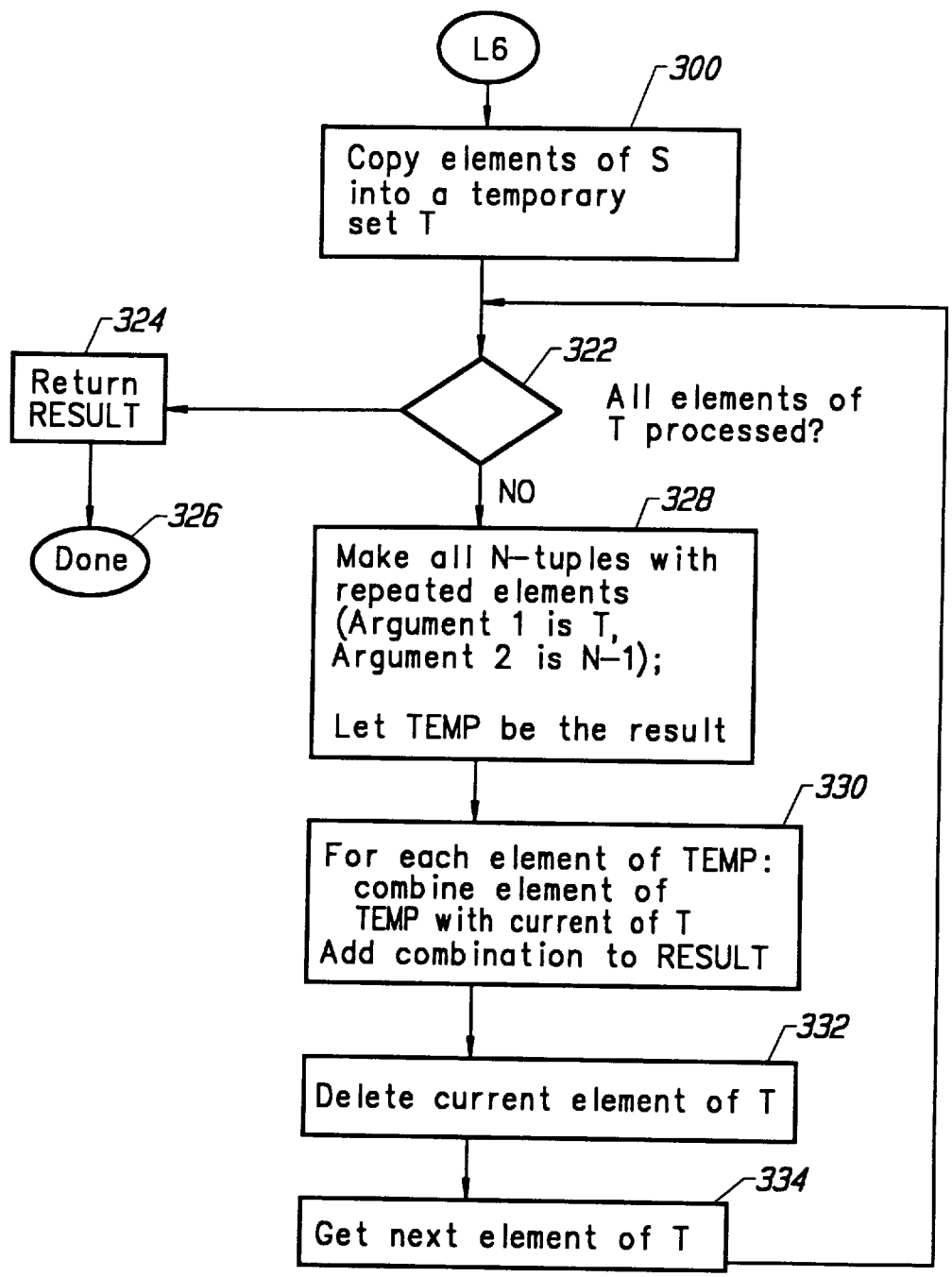
Figure 17:
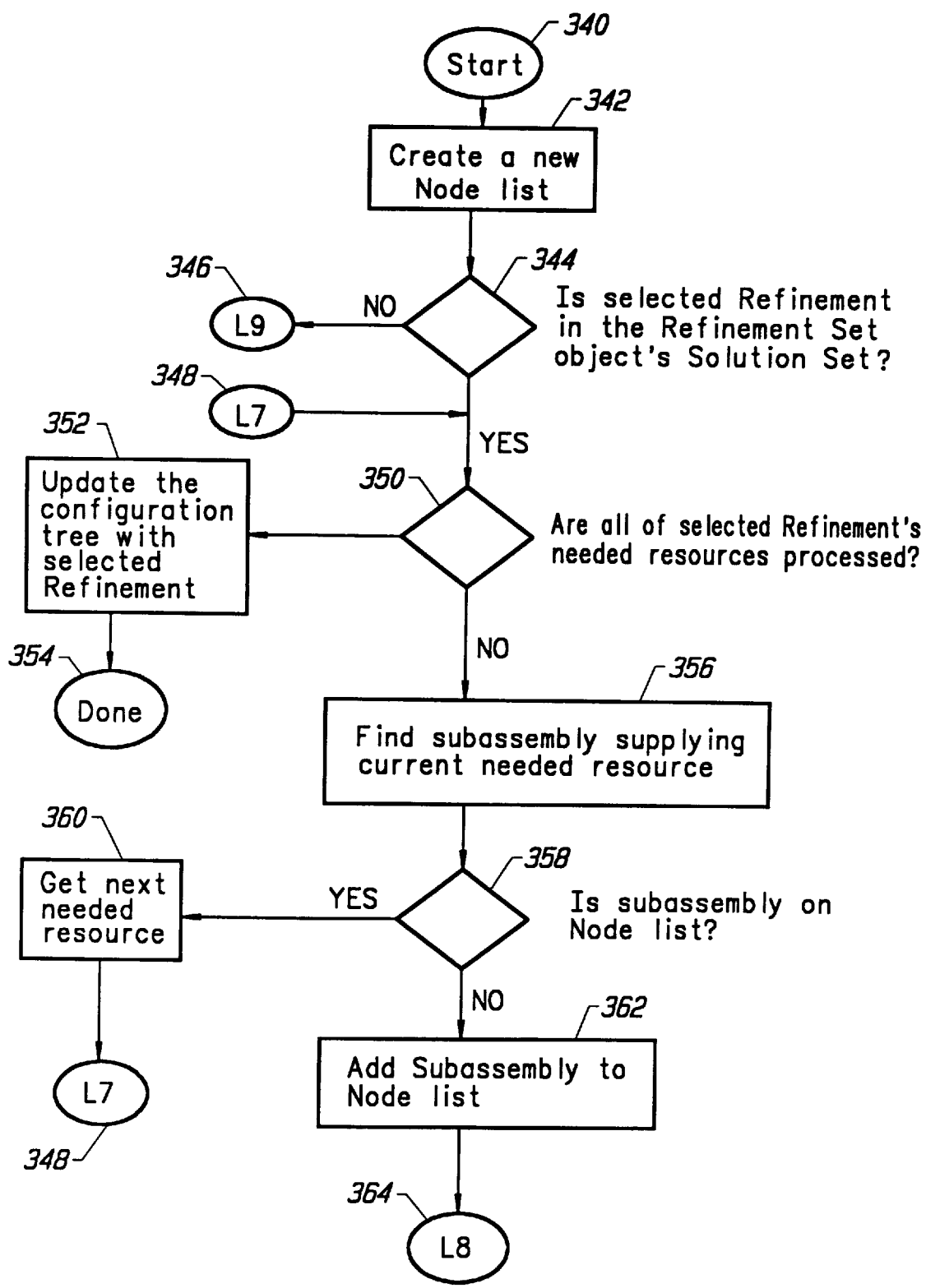
FIGS. 17, 18, 19, and 20 show the process of integrating a refinement into a configuration when some of the refinement's needed resources are not supplied in adequate amounts by the configuration in its current state.
Figure 18:
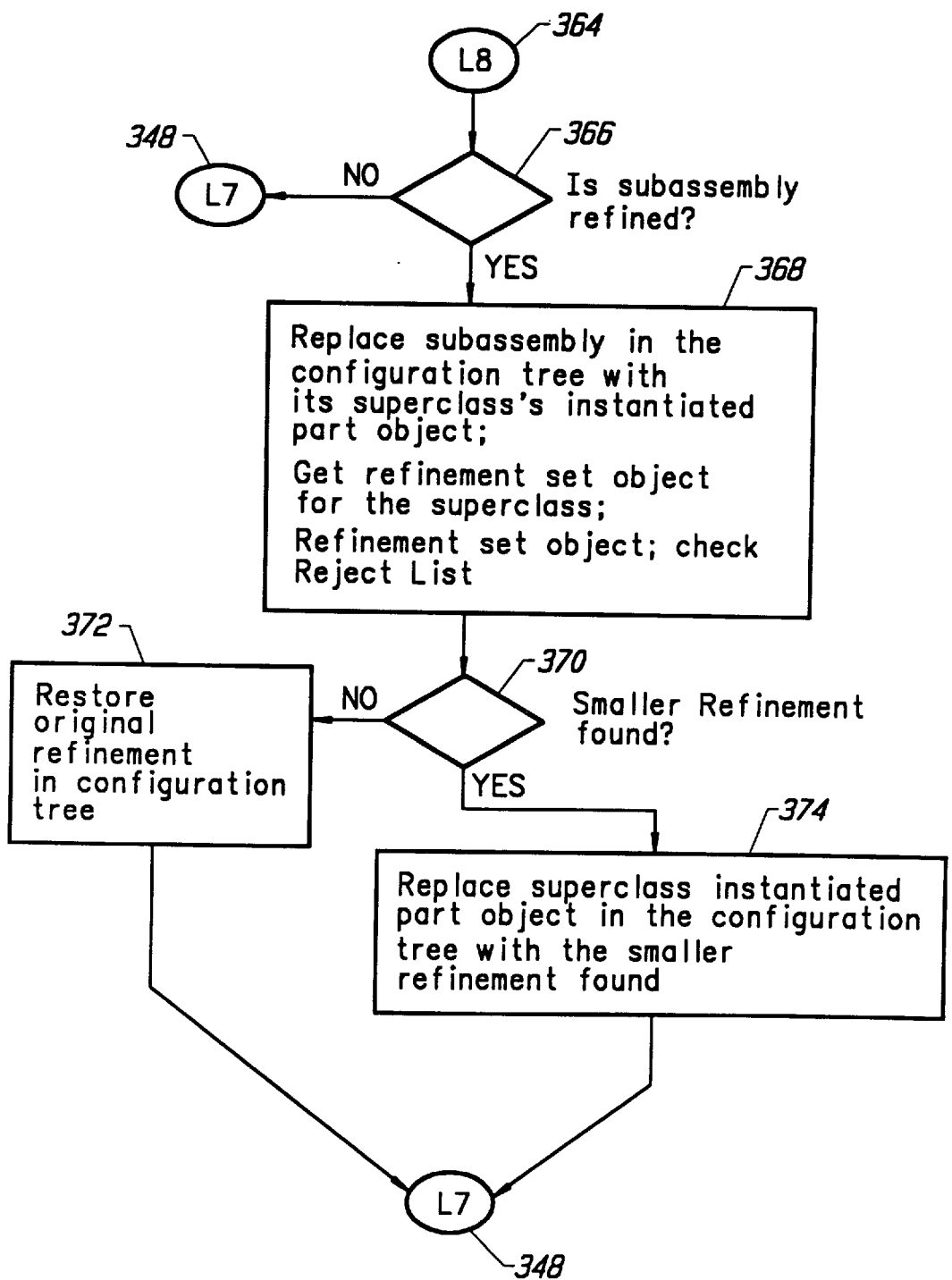
Figure 19:
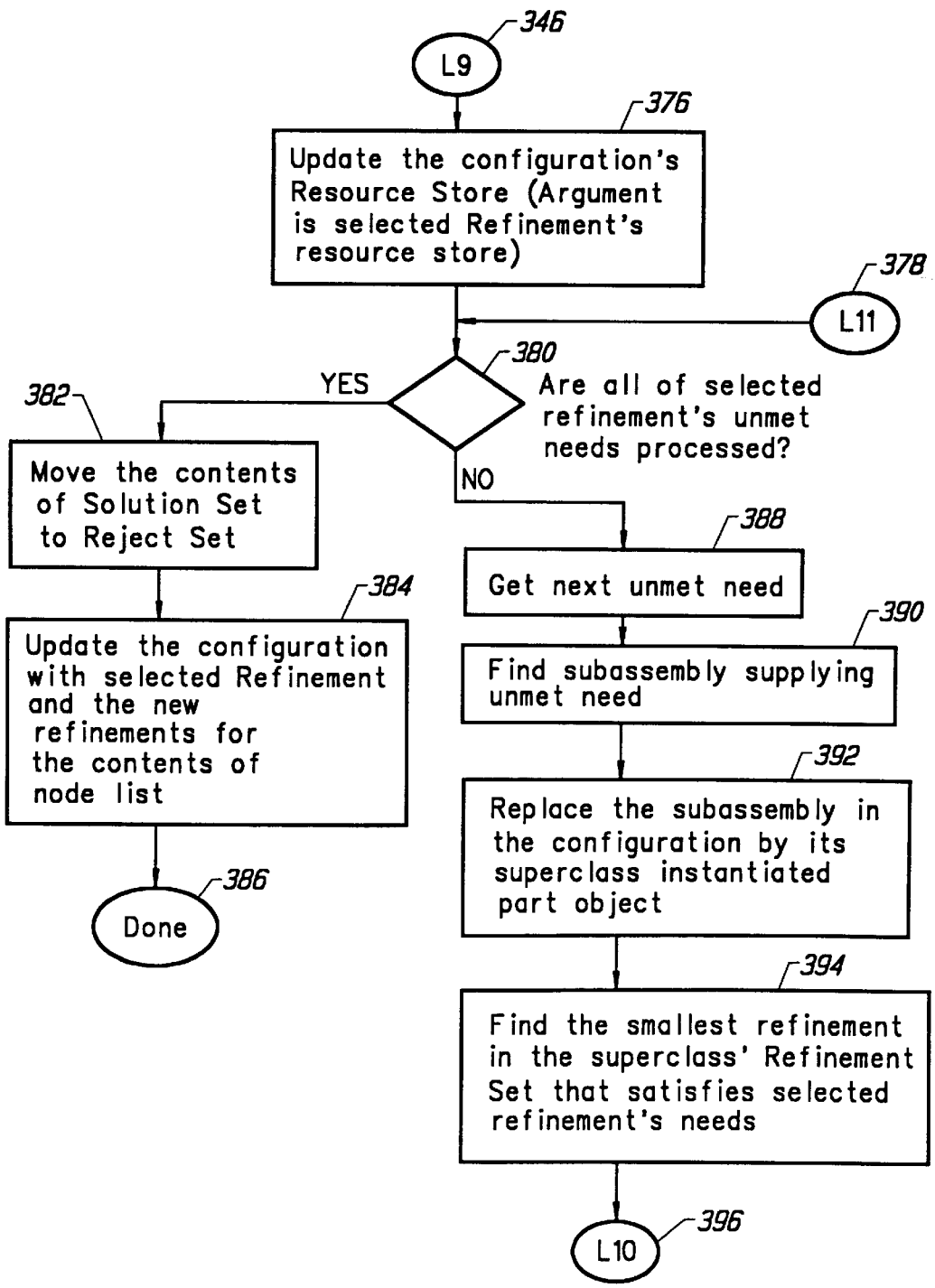
Figure 20:
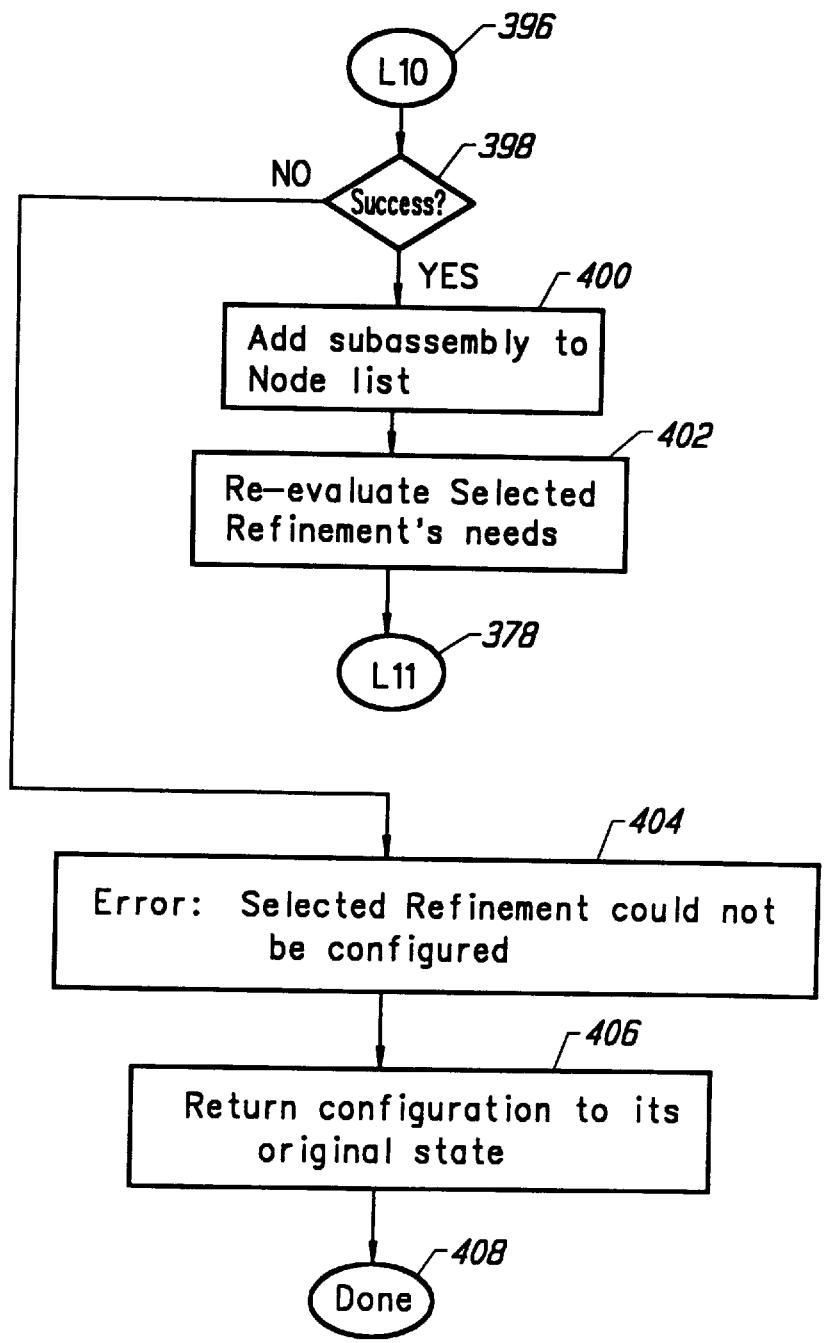
Figure 21:
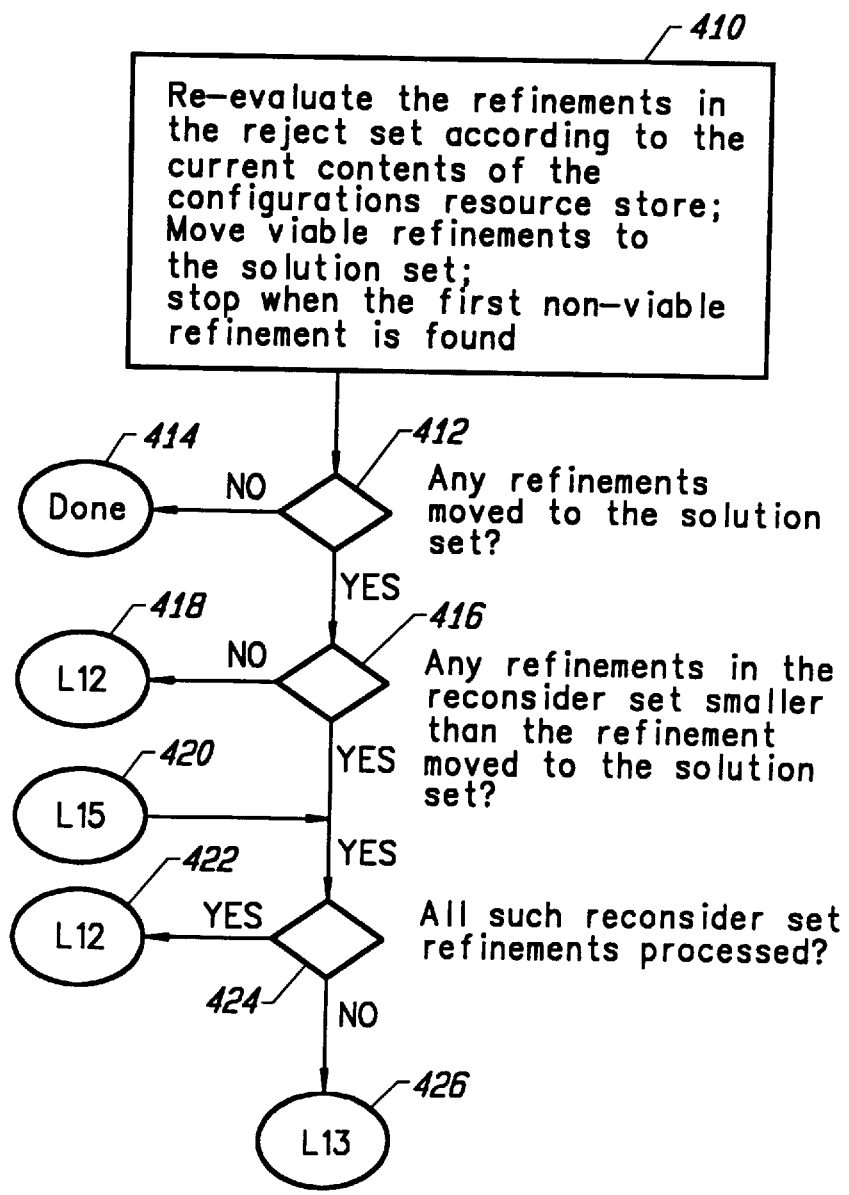
FIGS. 21, 22, 23, 24, and 25 show the process of searching for and replacing the subassemblies that supply resources to a particular subassembly when the former possibly supplies an excessive amount of resources.
Figure 22:
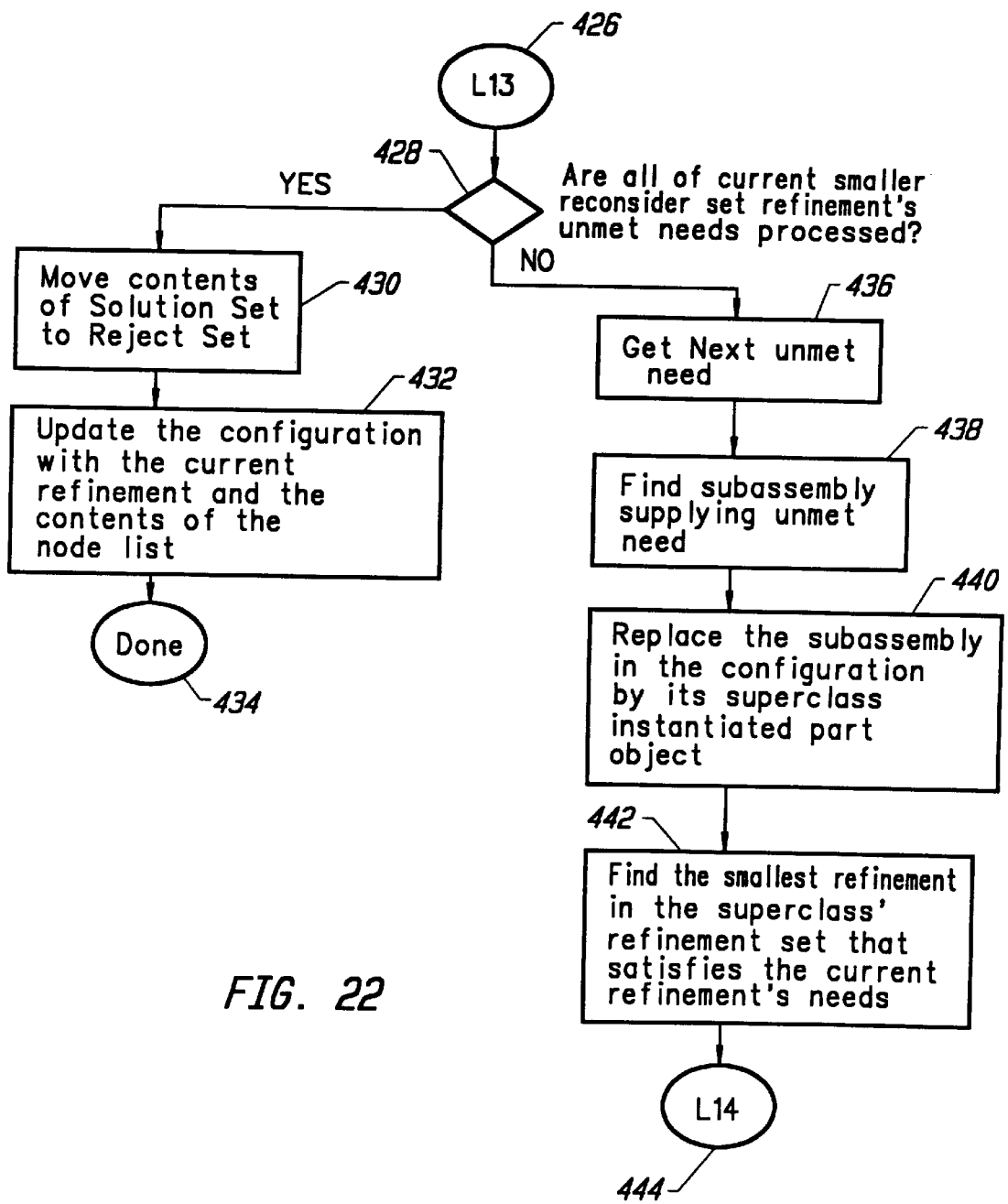
Figure 23:
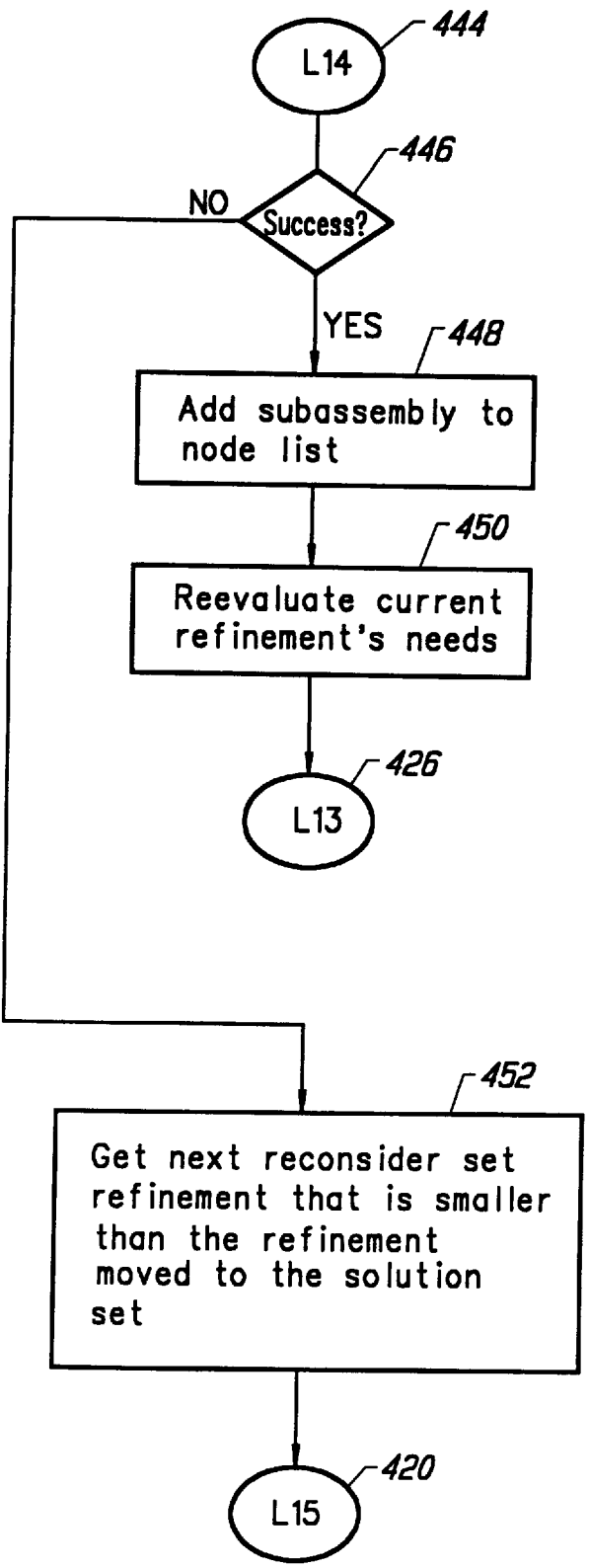
Figure 24:
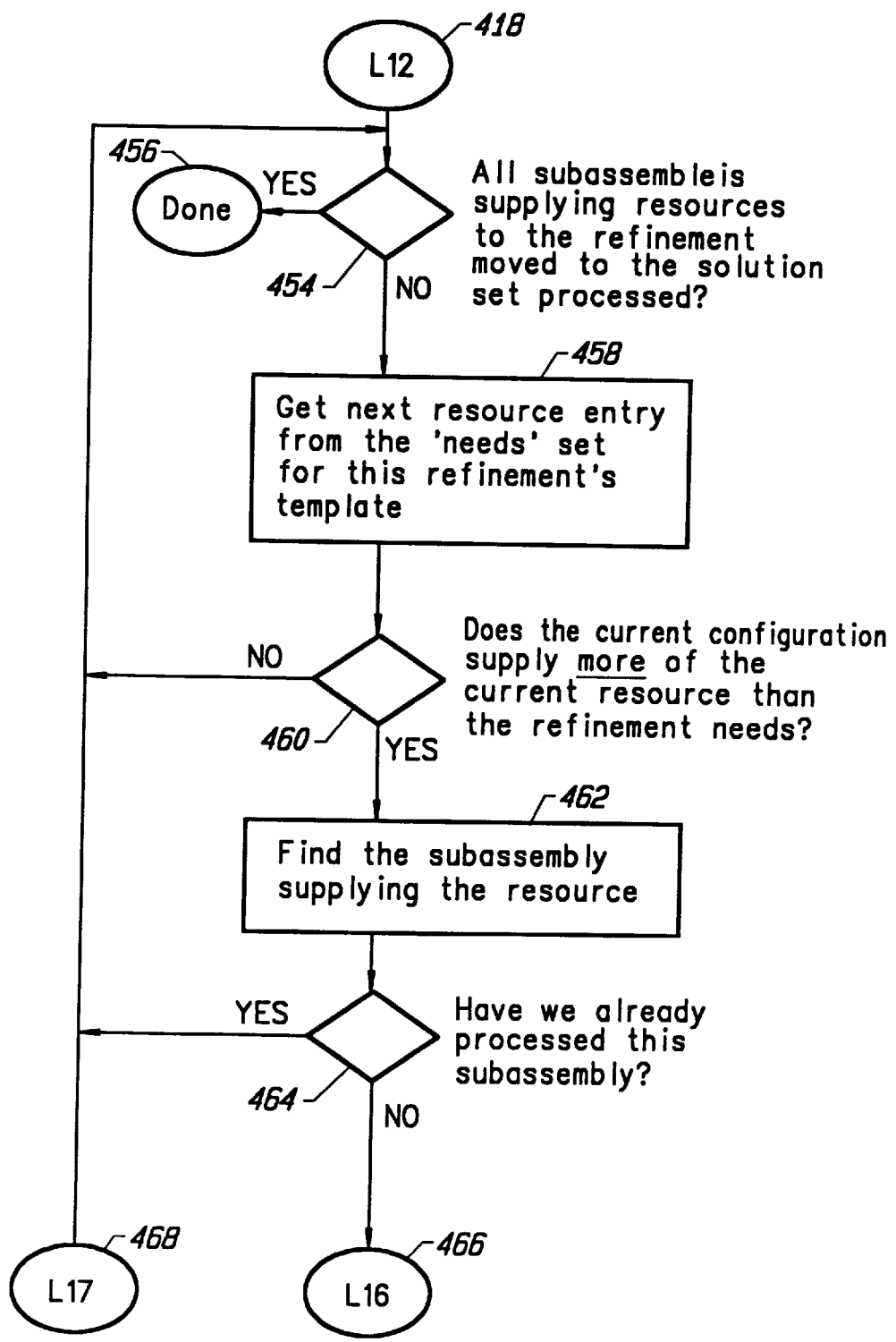
Figure 25:
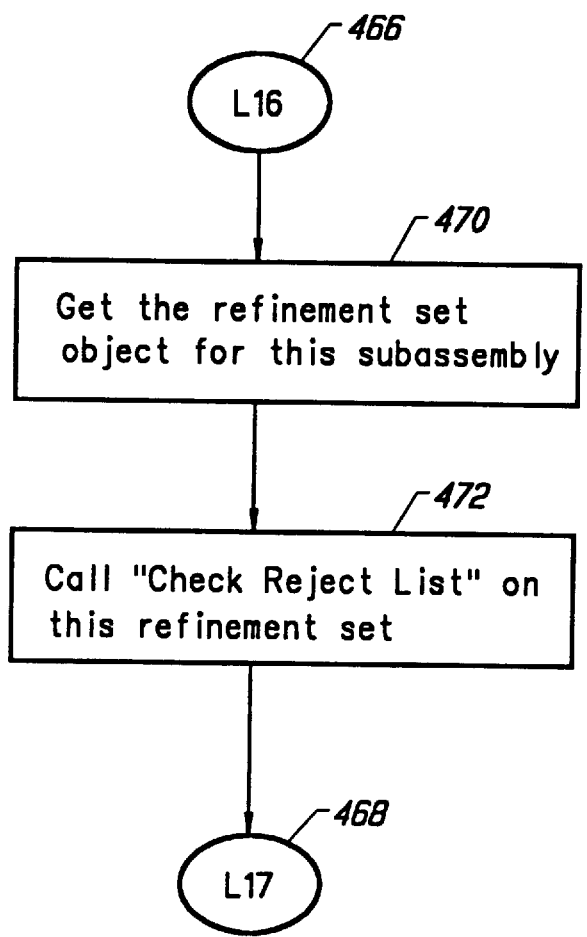

Making and classifying refinements calls another procedure from step 272—a process to make all n-tuples with repeated elements, as detailed in FIGS. 15 and 16. FIGS. 15 and 16 describe a recursive process that accepts two arguments: 1) a set of initial instantiated part objects (one for each of the subclasses of the generic part being refined), and 2) the number of subclass IPOs to be included in the refinement.

Which refinement, if any, is selected to replace the generic part's Instantiated Part Object in the configuration tree depends on whether the Configuration is in automatic or manual mode. The Configurator is placed in one mode or the other by the user by means of a menu selection. In manual mode the user is presented, in a dialog box, with a list of descriptions of the refinements in the Solution and Reconsider sets. He or she chooses one which is then substituted into the configuration tree. In automatic mode the Configurator will insert the smallest (or largest) refinement with respect to the primary selector from the Solution Set into the configuration tree, if the Solution Set is non-empty. If the solution set is empty, it will use the smallest (or largest) refinement in the Reconsider Set.

If a refinement from the Reconsider Set is selected, further processing is required. Some of the refinement's resource needs are not met by the configuration. The Configurator must find the parts supplying the resources in question and look for alternative refinements of those parts's generic part that do supply an adequate amount of the resources in question.

FIGS. 17, 18, 19, and 20 depict the process of getting a selected refinement. The process accepts three arguments as input: 1) a refinement set object and refinement set, 2) an index indicating the user's selection in selected refinement, and 3) a configuration tree. As output, the process creates a new configuration tree.

The computational problem of finding the minimal or maximal configuration with respect to a primary selector is theoretically intractable as it involves minimization or maximization over a tree. The Configurator deals with this problem by using a monotonicity heuristic. Consider the minimization case. The Configurator's algorithms assume that if a solution S1 is smaller than a solution S2 with respect to the primary selector, then S2 supplies no less of any resource than S1.. This means that the Configurator never has to "back up" when computing configurations automatically, i.e. once a solution has been rejected because it fails to satisfy a configuration constraint it never has to be reconsidered unless the constraints change (due to manual intervention).

The Configurator also allows the user to "Undo" an existing refinement. That is, the selected refinement is replaced in the configuration tree with the Instantiated Part Object for the generic part that it originally replaced. This action is invoked by selecting a subassembly in the visual display with the pointing device and then making a menu selection. Once the Instantiated Part Object for the generic part is back in the configuration tree, it may be re-refined in manual mode. The user may select a new refinement that is smaller than the one previous in the configuration. If this is the case, other parts of the configuration may supply more of the resources required by the new refinement than it needs. In this case the configuration can be made smaller by replacing some of its parts with cheaper refinements of their generic parts. The Configurator does this automatically.

FIGS. 21, 22, 23, and 24 describe the process of checking a refinement set's reject list. When it is possible that a supplier of a new refinement supplies more of a resource than the refinement requires, the supplier's refinement set object's reject list is checked for smaller (with respect to the configuration's selector) refinements that supply an adequate amount of the resource. If any such are found, the smallest is substituted for the current supplier's refinement object in the configuration tree. This process is iterated over all suppliers of the new refinement.

In summary, the present invention is a novel system that allows a user to describe part objects with an easy graphical interface and supply those descriptions (i.e. templates) to the presently claimed system. The present invention then takes those templates and automatically creates the necessary part objects and their classes.

These objects and classes are then supplied to the configurator generator and a resulting configurator is constructed. The configurator may then be used by the user to create particular configurations according to the needs of the customer. It will be appreciated that the creation of the configurator for a given domain may be accomplished without the need for expensive programming expertise.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A system including a computer for creating a set of end product configurations from a series of partially completed configurations, each said end product configuration comprising a subassembly of instantiated parts, each said instantiated part belonging to a class, said class being represented by a prestored template capable of being displayed on a display, each said instantiated part selectable by said system according to a set of user-supplied descriptions, and wherein said partially completed configuration is capable of being valid or invalid, said system comprising:

storage means for storing said user-supplied descriptions of the class of instantiated parts;

retrieval means for retrieving said prestored templates from said storage means, said templates providing said user-supplied descriptions;

display means for displaying said templates and said partially completed configurations on a display;

creation means for creating instantiated parts from said templates;

combine means for combining a plurality of said instantiated parts together to form said partially completed configuration for storage and later retrieval; and determination means for determining whether said partially completed configuration is valid or invalid.

2. A system as recited in claim 1 wherein each said partially completed configuration comprises a set of said instantiated parts, each said instantiated part representing a generic part or actual part and wherein said means for combining said instantiated part into said configuration further comprises:

substituting means for substituting said instantiated parts representing actual parts for said instantiated parts representing generic parts in a first said partially completed configuration to produce a second said partially completed configuration.

3. A system as recited in claim 2 wherein an instantiated part representing a generic part and a refine operation are part of a menu displayed on said display means, said system further comprising:

selection means for a user to select both an instantiated part representing a generic part and a refine operation from said menu to generate a selected instantiated part representing generic part and a selected refine operation.

4. A system as recited in claim 3 wherein said determination means for determining whether said partially completed configuration is valid or invalid refines said partially completed configuration by adding instantiated parts representing actual parts to said partially completed configuration as a result of applying to said partially completed configuration said selected instantiated part representing generic part and said selected refine operation.

5. A system as recited in claim 4 wherein said display means displays partially completed configurations to which said selected refine operation has been applied.

6. A system as recited in claim 1 wherein said means for storing user-supplied descriptions further comprises a graphical interface having pre-defined fields for entry of information pertaining to said description.

7. A system as recited in claim 6 wherein said graphical interface is a dialogue box.

8. A system as recited in claim 6 wherein said graphical interface is menu driven.

9. A system as recited in claim 6 wherein said information is a set of resources and attributes of said instantiated part class.

10. A system as recited in claim 2 wherein means for substituting further comprises:

means for checking that the class of said actual part is a subclass of said generic part;

means for checking that the resources needed by said actual part are met by said partially completed configuration;

means for checking that the resources supplied by said actual part meet the needs of the partially completed configuration; and means for choosing an actual part from among a set of actual parts according to a selection criteria.

11. A system including a computer for creating a set of end product configurations representing a computer configuration from a series of partially completed configurations, each said end product comprising a subassembly of instantiated parts, each said instantiated part belonging to a class of computer parts, said class being represented by a prestored template capable of being displayed on a display, each said instantiated part selectable by said system according to a set of user-supplied descriptions, and wherein said partially completed configuration is capable of being valid or invalid, said system comprising:

storage means for storing said user-supplied descriptions of the class of instantiated parts;

retrieval means for retrieving said prestored templates from said storage means, said templates providing said user-supplied descriptions;

display means for displaying said templates and said partially completed configurations on a display;

creation means for creating instantiated parts from said templates; and combine means for combining a plurality of said instantiated parts together to form said partially completed configuration for storage and later retrieval in generating said set of end product configurations representing a computer configuration.

12. A system as recited in claim 11 wherein each said partially completed configuration comprises a set of said instantiated parts, each said instantiated part representing a generic part or actual part and wherein said means for combining said instantiated part into said configuration further comprises:

substituting means for substituting said instantiated parts representing actual parts for said instantiated parts representing generic parts in a first said partially completed configuration to produce a second said partially completed configuration of selected instantiated parts representing generic parts.

13. A system as recited in claim 11 further comprising:

determination means for determining whether said partially completed configuration is valid or invalid.

* * * * *